US012619311B2

(12) United States Patent
Jeong et al.

(10) Patent No.: US 12,619,311 B2
(45) Date of Patent: May 5, 2026

(54) AUDIO HAPTIC OUTPUT APPARATUS AND HOME APPLIANCE INCLUDING THE SAME

(71) Applicant: LG ELECTRONICS INC., Seoul (KR)

(72) Inventors: Donguk Jeong, Seoul (KR); Youngeun Cho, Seoul (KR); Joontae Kim, Seoul (KR); Junhan Park, Seoul (KR); Byungjae Choi, Seoul (KR); Onyu Jeon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 18/742,983

(22) Filed: Jun. 13, 2024

(65) Prior Publication Data

US 2025/0021162 A1     Jan. 16, 2025

(30) Foreign Application Priority Data

Jun. 15, 2023     (KR) ......................... 10-2023-0076869

(51) Int. Cl.
*G06F 3/01*     (2006.01)
*B67D 1/08*     (2006.01)
(Continued)

(52) U.S. Cl.
CPC .......... *G06F 3/016* (2013.01); *B67D 1/0878* (2013.01); *G06F 3/0416* (2013.01);
(Continued)

(58) Field of Classification Search
CPC ....... B67D 1/0878; G06F 3/016; G06F 3/041; G06F 3/0416; G06F 3/16; H03G 3/005;
(Continued)

(56) References Cited

U.S. PATENT DOCUMENTS 9,519,346 B2 *  12/2016  Lacroix ................ G10L 19/008
2002/0149561 A1 *  10/2002  Fukumoto ........... G06F 3/04886
345/156

(Continued)

FOREIGN PATENT DOCUMENTS

JP         2013008118 A     1/2013
KR     10-2010-0007380 A     1/2010
(Continued)

OTHER PUBLICATIONS

Children's Television Workshop, Sesame Street, Episode 0930, "Linda's Birthday", aired Dec. 3, 1976, description printed from Muppet Wiki as it appears Aug. 16, 2025. (Year: 1976).*

(Continued)

*Primary Examiner* — Julie Anne Watko
(74) *Attorney, Agent, or Firm* — Bryan Cave Leighton Paisner LLP

(57)     ABSTRACT

According to an embodiment of the present disclosure, an audio haptic output apparatus and a home appliance include: a touch panel; a memory storing a plurality of effect data corresponding to a plurality of touch inputs; a processor calling the effect data matched with the touch input through the touch panel from the memory, and generating an audio signal; a speaker amplifier amplifying and outputting a signal based on the audio signal; and an actuator outputting at least one of an audio and a haptic based on the output signal of the speaker amplifier, and the processor or the speaker amplifier converts and outputs the frequency characteristics of the audio signal when the effect data matched with the touch input through the touch panel includes audio data.

17 Claims, 27 Drawing Sheets

(51) Int. Cl.

| | | |
|---|---|---|
| *G06F 3/041* | (2006.01) | |
| *H03G 3/30* | (2006.01) | |
| *H04R 1/02* | (2006.01) | |
| *H04R 3/04* | (2006.01) | |

(52) U.S. Cl.
CPC .......... *H03G 3/3005* (2013.01); *H04R 1/028* (2013.01); *H04R 3/04* (2013.01); *H03G 2201/103* (2013.01); *H04R 2430/01* (2013.01); *H04R 2499/15* (2013.01)

(58) Field of Classification Search
CPC .... H03G 2201/103; H04R 1/028; H04R 3/04; H04R 2430/01; H04R 2499/15
See application file for complete search history.

(56) References Cited

U.S. PATENT DOCUMENTS

2009/0277295 A1* 11/2009 Bryan ...................... G05G 7/02
74/469

2012/0306631 A1* 12/2012 Hughes ............... H04M 19/047
340/407.1
2018/0286190 A1* 10/2018 Fairbourn .............. H04R 9/066
2020/0082636 A1* 3/2020 Rudell .................. A63F 13/212

FOREIGN PATENT DOCUMENTS

| KR | 10-2014-0030053 A | 3/2014 |
|---|---|---|
| KR | 10-2016-0078226 A | 7/2016 |
| KR | 10-2016-0145844 A | 12/2016 |

OTHER PUBLICATIONS

CEvin Key, "cEvin Key (Skinny Puppy) talks about the SUBPAC" (https://youtu.be/rGkfEZk4t1M?si=UJY_8N8C1UFfVURe), posted Aug. 19, 2014. (Year: 2014).*
Adam Savage's Tested, "Hands-On: VR Haptics with Ultrasonic Speakers" (https://youtu.be/CIFUlyfyiYg?si=95ebaOCwSSJ39hrh), posted Mar. 11, 2022. (Year: 2022).*

* cited by examiner

Audio

Haptic

Sequential combination of haptic and audio

Audio Signal

Haptic Signal

1

AUDIO HAPTIC OUTPUT APPARATUS AND HOME APPLIANCE INCLUDING THE SAME

This application claims the benefit of Korean Patent Application No. 10-2023-0076869, filed on Jun. 15, 2023, the contents of which is hereby incorporated by reference in its entirety.

TECHNICAL FIELD

The present disclosure relates to an audio haptic output apparatus and an home appliance including the same, and more particularly, to an audio haptic output apparatus and an home appliance including the same, which can output an audio and a haptic by using an actuator.

BACKGROUND

Electronic devices have various input and output means. For example, the electronic devices can output visual information through displays and output auditory information through speakers. Further, in recent years, a haptic effect has been output to inform the user's touch input or specific state. Haptic technology is a technology that uses power, vibration, and motion to output a predetermined pattern so that the user feels touched. The electronic device may include a vibration device for providing audio, and a vibration device for providing the haptic effect to the user. The vibration devices are often implemented using actuators.

FIGS. 21 and 22 are diagrams referenced for an audio haptic output apparatus in related art, and FIG. 21 illustrates an input/output device outputting a haptic, and a voice ment/audio in response to an input through a touch panel, and FIG. 22 illustrates frequency-specific gravity acceleration measurement results of a general haptic actuator a general audio actuator.

In an order illustrated in FIG. 21, when a user touches a specific operation button, touch operation button data is delivered to a signal processor, and the signal processor loads haptic/audio data of the corresponding button. A memory stores haptic data and audio data matched with each touch operation button. The haptic/audio data loaded by the signal processor is each decoded, and a decoded haptic signal and a decoded audio signal are delivered to an amplification haptic driver and an amplification audio amplifier (AMP). The amplified haptic signal is delivered to a vibration actuator, and the amplified audio signal is delivered to a speaker. The haptic actuator and the audio actuator use different frequency domains, so it is difficult to combinationally use the haptic actuator and the audio actuator.

Existing technology implements a drive system separately when implementing haptic and audio, and also receives each of input signals or generates the haptic signal in the audio signal through a separate algorithm, and then operates the haptic and the audio. In EP Patent Unexamined Publication EP 3 748 474 A1 which is Prior Document 1, the separately received haptic and audio signals are combined through a mixer, and transmitted to the haptic actuator and the speaker audio actuator, and in US Patent Application US 2022 0197389 A1, a processor generates the haptic signal in the audio signal, and transmits the audio signal and the haptic signal to the speaker and the actuator, respectively.

As in the prior documents, in general, the audio is output by using the speaker, and the haptic actuator is used for the haptic. When the actuator is used for the audio, an operating frequency band varies, so the audio actuator is not used for the haptic.

Referring to FIGS. 21 and 22, due to resonance frequency characteristics of the actuator, the haptic and the audio are generally used by configuring a separate system. The haptic actuator is formed in a frequency band (60 to 200 Hz) having a low resonance frequency, and a vibration displacement amount in resonance is also very large, so the haptic actuator is advantageous for generating a vibration sense. The audio actuator is formed in a frequency band (300 to 600 Hz) having higher resonance, and after the resonance, a vibration displacement reduction level is also more gently formed compared to the haptic.

Since the haptic actuator aims at vibration, a vibration displacement amount is small in an audio frequency domain. Further, when an output is increased to output the audio by the haptic actuator, the vibration displacement amount is very large in a low-frequency signal around the resonance frequency, so an inter-part collision and actuator damage occur. The audio actuator aims at sound, and has a very weak output with respect to the low-frequency signal for vibration, so vibration power capable showing a haptic performance is not generated. Accordingly, the haptic and the audio are configured as separate systems for audio/haptic output having sufficient performance, and cost and system complexity increase due to implementation of respective functions.

SUMMARY

In view of the above, the present disclosure provides an audio haptic output apparatus and a home appliance including the same, which can output both audio and haptic by one actuator.

In view of the above, the present disclosure provides an audio haptic output apparatus and a home appliance including the same which can an inter-part collision and damage due to vibration of an actuator to enhance reliability.

In view of the above, the present disclosure provides an audio haptic output apparatus and a home appliance including the same which are easily designed by reduction of system complexity and can reduce cost due to a decrease in number of parts.

In view of the above, the present disclosure provides an audio haptic output apparatus and a home appliance including the same, which can output various effects.

In view of the above, the present disclosure provides an audio haptic output apparatus and a home appliance including the same, which can output a high-quality audio.

In view of the above, the present disclosure provides a home appliance which can prevent moisture penetration from the outside and has a high degree of freedom in design because a speaker hole need not be separately made.

An audio haptic output apparatus and a home appliance according to embodiments of the present disclosure may output both an audio and a haptic by one common actuator.

The audio haptic output apparatus and the home appliance according to the embodiments of the present disclosure appropriately control a frequency of a signal input into the actuator according to an output to prevent damage to the actuator and enhance the life-span of the actuator.

The audio haptic output apparatus and the home appliance according to the embodiments of the present disclosure combine an audio signal and a haptic signal, and store the combined signal in a memory to more effectively output the audio and the haptic according to a situation.

According to an embodiment of the present disclosure, an audio haptic output apparatus and a home appliance may include: a touch panel; a memory storing a plurality of effect data corresponding to a plurality of touch inputs; a processor calling the effect data matched with the touch input through the touch panel from the memory, and generating an audio signal; a speaker amplifier amplifying and outputting a signal based on the audio signal; and an actuator outputting at least one of an audio and a haptic based on the output signal of the speaker amplifier, and the processor or the speaker amplifier converts and outputs the frequency characteristics of the audio signal when the effect data matched with the touch input through the touch panel includes audio data to stably output both the audio and the haptic by one common actuator.

The processor converts the called effect data into an analog audio signal or an audio signal according to an audio communication standard.

The processor or the speaker amplifier converts the frequency characteristics of the audio signal according to different frequency conversion logics when the actuator outputs both the audio and the haptic, and when the actuator outputs only the audio to prevent the damage of the actuator and enhance the life-span, and output the audio and the haptic with a high quality.

The processor or the speaker amplifier converts the frequency characteristics of the audio signal by increasing a gain only in a predetermined audio region frequency band predetermined in a voice guidance or button sound when the actuator outputs an audio and a haptic of the voice guidance or button sound.

The processor or the speaker amplifier converts the frequency characteristics of the audio signal by increasing a gain in a predetermined audio region frequency band predetermined in a voice guidance or button sound to be larger than the gain in a haptic frequency domain when the actuator outputs an audio and a haptic of the voice guidance or button sound.

The processor or the speaker amplifier converts the frequency characteristics of the audio signal by applying a first gain in a first frequency in the audio region frequency band predetermined in the voice guidance or button sound and applying a second gain larger than the first gain in a second frequency larger further to a resonance frequency of the actuator than the first frequency when the actuator outputs the audio and the haptic of the voice guidance or button sound.

The processor or the speaker amplifier converts the frequency characteristics of the audio signal by amplifying an audio region frequency band predetermined in a voice guidance or button sound when the actuator outputs only the audio of the voice guidance or button sound.

The processor or the speaker amplifier converts the frequency characteristics of the audio signal by attenuating a predetermined range of frequency band at the resonance frequency of the actuator, and amplifying a frequency band of at least some among other regions when the actuator outputs only the music-type audio.

The processor or the speaker amplifier does not convert the frequency characteristics of the audio signal when the actuator outputs only the haptic, or converts the frequency characteristics of the audio signal by a region which deviates from a predetermined range of frequency band at a resonance frequency of the actuator.

The processor or the speaker amplifier converts the frequency characteristics of the audio signal according to different frequency conversion logics when the actuator outputs only the haptic, and when the actuator outputs both the audio and the haptic, and the speaker amplifier amplifies the signal of which frequency is converted.

The plurality of effect data stored in the memory includes the haptic data, the audio data, and the combination data in which the haptic data and the audio data are combined in advance.

The haptic data, the audio data, and the combination data are encoded to audio type data, and stored.

The combination data is generated by sequentially combining the haptic data and the audio data in order, or generated by mixing the haptic data and the audio data to overlap.

The processor or the speaker amplifier converts and outputs the frequency characteristics of the audio signal so that the vibration of the actuator upon the touch input into a second region positioned further from the actuator than a first region is larger than the vibration of the actuator upon the touch input into the first region in the touch panel.

According to an embodiment of the present disclosure, an audio haptic output apparatus and a home appliance may include: a touch panel; a memory storing a plurality of effect data corresponding to a plurality of touch inputs; and an actuator capable of outputting at least of an audio and a haptic based on the effect data matched with the touch input through the touch panel among the data stored in the memory, and the plurality of effect data stored in the memory may include the haptic data, the audio data, and the combination data in which the haptic data and the audio data are combined in advance.

The combination data may be generated by sequentially combining the haptic data and the audio data in order, or generated by mixing the haptic data and the audio data to overlap.

According to an embodiment of the present disclosure, the audio haptic output apparatus and the home appliance may further include: a processor calling the effect data matched with the touch input through the touch panel from the memory, and generating an audio signal; a speaker amplifier amplifying and outputting a signal based on the audio signal; and the processor or the speaker amplifier may convert and output the frequency characteristics of the audio signal so that the vibration of the actuator upon the touch input into a second region positioned further from the actuator than a first region is larger than the vibration of the actuator upon the touch input into the first region in the touch panel. According to an embodiment of the present disclosure, the audio haptic output apparatus and the home appliance may further include: a processor calling the effect data matched with the touch input through the touch panel from the memory, and generating an audio signal; a speaker amplifier amplifying and outputting a signal based on the audio signal; and an actuator capable of outputting at least one of the audio and the haptic based on the output signal of the speaker amplifier, and the processor or the speaker amplifier may convert and output the frequency characteristics of the audio signal when the effect data matched with the touch input through the touch panel includes audio data.

The processor may convert the called effect data into an analog audio signal or an audio signal according to an audio communication standard.

The processor or the speaker amplifier may convert the frequency characteristics of the audio signal according to different frequency conversion logics when the actuator outputs both the audio and the haptic, and when the actuator outputs only the audio.

The processor or the speaker amplifier may convert the frequency characteristics of the audio signal by increasing a gain only in a predetermined audio region frequency band predetermined in a voice guidance or button sound when the actuator outputs an audio and a haptic of the voice guidance or button sound.

The processor or the speaker amplifier may convert the frequency characteristics of the audio signal by increasing a gain in a predetermined audio region frequency band predetermined in a voice guidance or button sound to be larger than the gain in a haptic frequency domain when the actuator outputs an audio and a haptic of the voice guidance or button sound.

The processor or the speaker amplifier may convert the frequency characteristics of the audio signal by applying a first gain in a first frequency in the audio region frequency band predetermined in the voice guidance or button sound and applying a second gain larger than the first gain in a second frequency larger further to a resonance frequency of the actuator than the first frequency when the actuator outputs the audio and the haptic of the voice guidance or button sound.

The processor or the speaker amplifier may convert the frequency characteristics of the audio signal by amplifying an audio region frequency band predetermined in a voice guidance or button sound when the actuator outputs only the audio of the voice guidance or button sound.

The processor or the speaker amplifier may convert the frequency characteristics of the audio signal by attenuating a predetermined range of frequency band at the resonance frequency of the actuator, and amplifying a frequency band of at least some among other regions when the actuator outputs only the music-type audio.

The processor or the speaker amplifier may not convert the frequency characteristics of the audio signal when the actuator outputs only the haptic, or convert the frequency characteristics of the audio signal by a region which deviates from a predetermined range of frequency band at a resonance frequency of the actuator.

The processor or the speaker amplifier may convert the frequency characteristics of the audio signal according to different frequency conversion logics when the actuator outputs only the haptic, and when the actuator outputs both the audio and the haptic, and the speaker amplifier may amplify the signal of which frequency is converted.

The processor or the speaker amplifier may convert and output the frequency characteristics of the audio signal so that the vibration of the actuator upon the touch input into a second region positioned further from the actuator than a first region is larger than the vibration of the actuator upon the touch input into the first region in the touch panel.

According to an embodiment of the present disclosure, an audio haptic output apparatus and a home appliance may include: a touch panel; a memory storing audio data and haptic data corresponding to a plurality of touch inputs; a processor calling at least one of the audio data and the haptic data matched with the touch input through the touch panel from the memory, and converting an audio signal; a speaker amplifier amplifying and outputting a signal based on the audio signal; and an actuator capable of outputting at least one of the audio and the haptic based on the output signal of the speaker amplifier, and may output both the audio and the haptic by one common actuator.

According to at least one of the embodiments of the present disclosure, qualities of raw water and purification water are measured by one sensor to cope with a water quality accident and purification water quality degradation by the raw water.

According to at least one of the embodiments of the present disclosure, a water pipe configuration and a rinse operation for sensor publicization can enhance sensing accuracy and efficiency.

According to at least one of the embodiments of the present disclosure, both the audio and the haptic can be output by one actuator.

According to at least one of the embodiments of the present disclosure, since an inter-part collision and damage due to vibration of the actuator can be prevented, there is an advantage of enhancing reliability and life-span.

According to at least one of the embodiments of the present disclosure, system complexity is reduced, so design is easy and the number of parts is reduced, cost reduction is possible.

According to at least one of the embodiments of the present disclosure, high-quality audio and haptic can be output.

According to at least one of the embodiments of the present disclosure, a home appliance which can prevent moisture penetration from the outside and has a high degree of freedom in design because a speaker hole need not be separately made.

Meanwhile, various other effects will be directly or implicitly disclosed in the detailed description according to the embodiment of the present disclosure to be described below.

DETAILED DESCRIPTION

Figure 1:
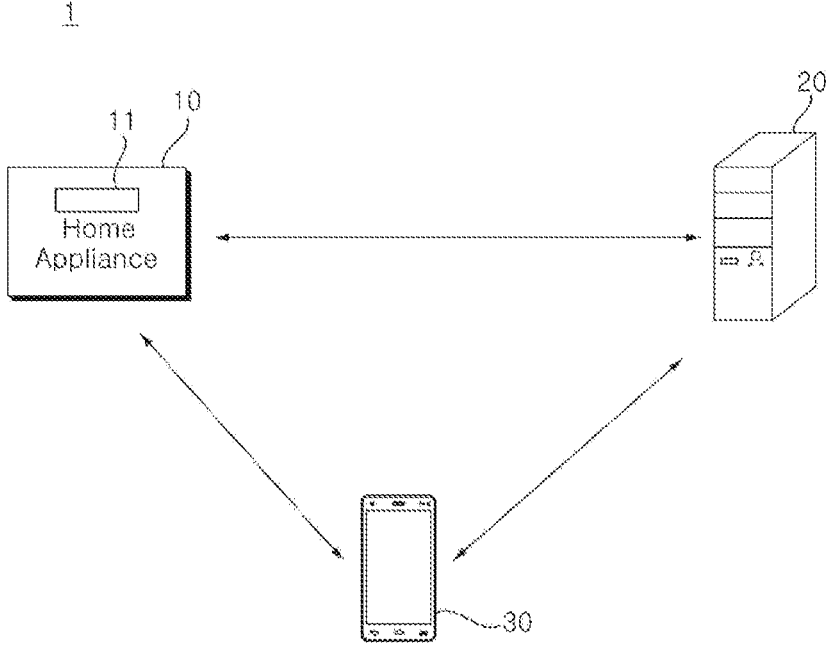
FIG. 1 is a home appliance system configuration diagram including a home appliance according to an embodiment of the present disclosure.

Hereinafter, an embodiment of the present disclosure will be described in detail with reference to the accompanying drawings. Hereinafter, the present disclosure is not limited to the embodiment, and may be transformed to various forms, of course.

In the drawings, in order to clearly and briefly describe the present disclosure, illustration of a part which is not related to the description is omitted, and throughout the present disclosure, the same or extremely similar part are denoted by the same reference numeral.

Meanwhile, "module" and "unit" for components used in the following description are given in consideration of easy preparation of the specification only and do not have their own particularly important meanings or roles. Accordingly, the "module" and "unit" may be used interchangeably.

Further, in the present disclosure, the terms such as first, second, etc., may be used for describing various components, but the components are not limited by the terms. The terms are used for distinguishing one component from another component.

FIG. 1 is a home appliance system configuration diagram including a home appliance according to an embodiment of the present disclosure.

Referring to FIG. 1, the home appliance system 1 according to an embodiment of the present disclosure may include one or more home appliances 10, a server 20, and a mobile terminal 30.

The home appliance 10 is an electronic device for a user, and as the home appliance 10, an air conditioner (not illustrated), an air purifier (not illustrated), a refrigerator (not illustrated), a washing machine (not illustrated), a cooking equipment (not illustrated), a cleaner (not illustrated), etc. may be exemplified, for example.

The home appliance 10 may include a communication unit (not illustrated) therein, and may exchange data with electronic devices in an internal network or electronic devices accessible through an external network. To this end, the communication unit (not illustrated) may wirelessly perform data exchange with the server 20, an AP device, etc.

Meanwhile, the mobile terminal 30 may perform wireless communication with the home appliance 10, and remote control a wirelessly connected home appliance 10, or receive monitoring data from the home appliance 10.

Meanwhile, the server 20 may transmit and receive data to and from the home appliance 10 connected through the network. For example, the server 20 may provide update information to the home appliance 10 by a request of the mobile terminal 30.

As another example, even though there is no request from the mobile terminal 30 or the home appliance 10, the server 20 may provide the update information to the home appliance 10 as necessary.

Meanwhile, the home appliance 10 according to an embodiment of the present disclosure includes an audio haptic output apparatus 11. The home appliance 10 may include a manipulation unit (not illustrated) receiving a user input, and the audio haptic output apparatus 11 is configured as a part of the manipulation unit or connected to the manipulation unit to output an audio effect, a haptic effect, and an audio/haptic effect.

The manipulation unit may include one or more buttons in order to receive the user input. The manipulation unit may be provided as a touch panel, and may include one or more buttons for manipulating the home appliance 10.

For example, when the home appliance 10 is the washing machine and a dryer, the manipulation unit may include one or more manipulation means for manipulating an operation mode such as washing/drying.

For example, when the home appliance 10 is the air conditioner, the manipulation unit may include buttons to select and control operation modes such as a cooling operation, an automatic operation, an air cleaning operation, etc.

For example, when the home appliance 10 is a water dispensing device, the manipulation unit may include a capacity button of selecting a water output capacity, a hot water button of selecting hot water, and selecting a temperature of output hot water, a water purification button of selecting purified water, a cooling water button of selecting cooling water, and other function buttons.

The audio haptic output apparatus 11 outputs the haptic effect in response to the user input through the manipulation unit, so the user may feel a feedback for an input thereof as a touch sense.

The audio haptic output apparatus 11 may output audios such as a button sound, a voice guidance met, music, etc., in response to the user input through the manipulation unit. Further, the audio haptic output apparatus 11 may output an effect sound for an operation state, and output a predetermined warning sound when an error occurs.

In addition, the audio haptic output apparatus 11 may provide a complex feedback to the user by outputting both the audio and the haptic.

A configuration and an operation of the audio haptic output apparatus 11 will be described below in detail with reference to FIGS. 2 to 20.

Meanwhile, the audio haptic output apparatus 11 is capable of upgrading the audio effect, the haptic effect, and the complex effect in which the audio and the haptic are combined. Accordingly, data for a new effect is received from the server 20 or the mobile terminal 30, and upgraded, so various effects may be extended and provided to the user without a limit. Accordingly, various functions and effects using the audio haptic output apparatus 11 may be provided in addition to an effect provided only a release time of the corresponding product.

The home appliance 10 may execute a system application, an operation mode related application, or a download application therein.

Meanwhile, the update information may include firmware update information, software update information, etc. The firmware update information as data for updating firmware in the home appliance 10 may be, for example, update information for a load control a safety control of the home appliance 10. Meanwhile, the software update information may include update information related to a new operation mode. The upgrade of the operation mode may be performed based on the upgrade information related to the new operation mode. Meanwhile, the software update information may further include update information for the system application, the operation mode related application, or the download application. The update of the operation mode may be performed based on the update information. The firmware update information may include date data for firmware, an operating system, or a framework. The firmware may be updated based on the firmware update information.

The upgrade information related to the new operation mode may be received from an external server 20 or the mobile terminal 30, and the upgrade for the new operation mode may be performed based on the upgrade information related to the new operation mode.

Meanwhile, the home appliance 10 according to an embodiment of the present disclosure may also perform update related to setting variation for the existing operation mode in addition to the upgrade for the new operation mode. The home appliance 10 according to an embodiment of the present disclosure may perform the update related to the audio haptic output apparatus 11.

Meanwhile, the home appliance system 1 may further include an access point (AP) device (not illustrated). The AP device may provide the internal network to an adjacent electronic device. In particular, the home appliance system 1 may provide a wireless network.

Meanwhile, the AP device may allocate a wireless channel by a predetermined communication scheme to the electronic devices in the internal network, and perform wireless data communication through the corresponding channel. Here, the predetermined communication scheme may be a WiFi communication scheme.

At this time, the mobile terminal 30 positioned in the internal network accesses the home appliance 10 through the AP device to perform monitoring, remote control, etc., for the home appliance 10.

Meanwhile, the AP device may perform data communication with an external electronic device through the external network in addition to the internal network. For example, the AP device may perform wireless data communication with the mobile terminal 30 positioned externally through the external network. At this time, the mobile terminal 30 positioned in the internal network accesses the home appliance 10 through the AP device to perform monitoring, remote control, etc., for the home appliance 10.

As another example, the AP device may perform the wireless data communication with the server 20 positioned externally through the external network.

Meanwhile, the server 20 may store firmware information, operation information (course information) for the home appliance 10, and register product information for the home appliance 10. For example, the server 20 may be a server operated by a manufacturer of the home appliance 10.

Figure 2:
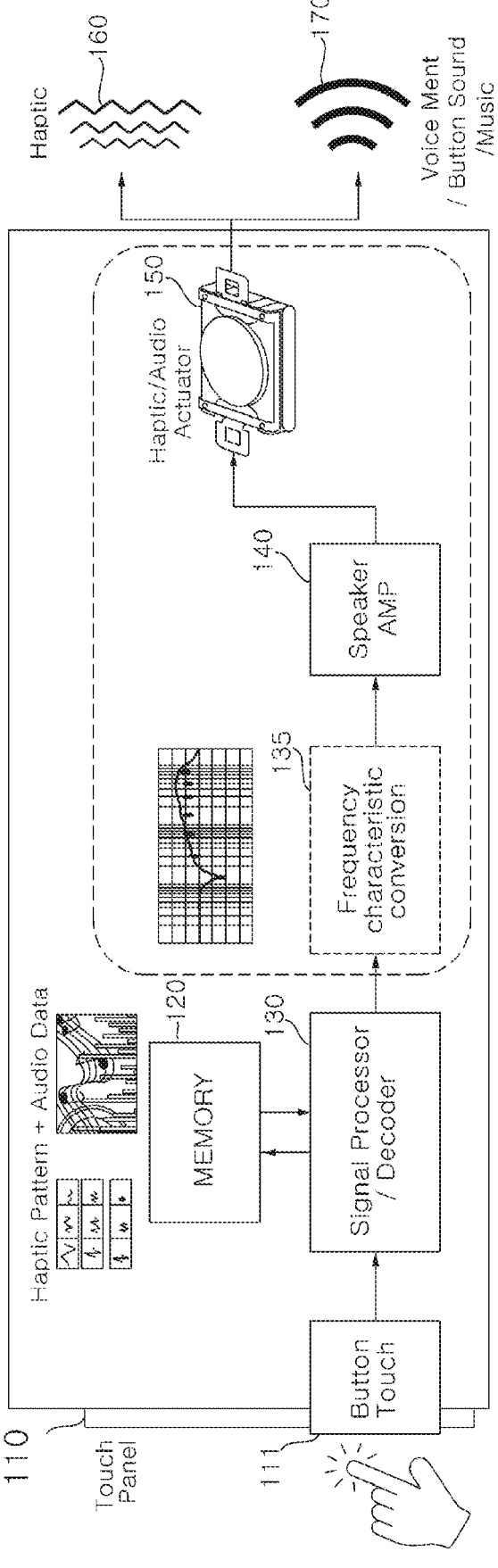
FIG. 2 is a block diagram of a main configuration of an audio haptic output apparatus according to an embodiment of the present disclosure.

FIG. 2 is a block diagram of a main configuration of an audio haptic output apparatus according to an embodiment of the present disclosure.

Referring to FIG. 2, the audio haptic output apparatus 11 and the home appliance 10 including the same according to an embodiment of the present disclosure include a touch panel 110, an actuator 150 outputting at least one of an audio or a haptic in response to a touch input 111 through the touch panel 110, and a memory 120 storing data for driving the actuator 150.

When there is a touch input in the touch panel 110, the actuator 150 may output an audio feedback effect or a haptic feedback effect, or a complex feedback effect in which the audio and the haptic are combined.

Further, the touch panel 110 may include a button, and the actuator 150 may output the audio feedback effect or the haptic feedback effect, or the complex feedback effect in which the audio and the haptic are combined.

The memory 120 stores a plurality of effect data corresponding to a plurality of touch inputs. Since the actuator 150 outputs at least one of the audio and the haptic, the memory 120 stores audio data and haptic data corresponding to the plurality of touch inputs. Further, according to the provided effect, as an effect corresponding to a specific input, the audio data and the haptic data are combined and stored. An audio signal and a haptic signal are combined and pre-stored in the memory 120 to more effectively output the audio and the haptic according to a situation. That is, a plurality of effect data stored in the memory 120 may include haptic data, audio data, and combination data in which the haptic data and the audio data are combined in advance.

The actuator 150 outputs at least one of the audio and the haptic based on effect data matched with a touch input 111 through the touch panel 110 among the data stored in the memory 120.

The actuator 150 may output having sizes of a frequency and an amplitude corresponding to a pattern of an input electrical signal. The vibration of the actuator 150 is made by the patterned electrical signal, and the electrical signal input into the actuator 150 is adjusted to control the vibration of the actuator 150.

The audio haptic output apparatus 11 and the home appliance 10 including the same according to an embodiment of the present disclosure further include a processor 130 signal-processes the data stored in the memory 120 to the electrical signal input into the actuator 150 and the signal to be output by the actuator 150, and a speaker amplifier 140 amplifying an output signal of the processor 130.

For example, the processor 130 may decode and output an encoded signal. The processor 130 may also be referred to as a decoder or a signal processor.

Further, the processor 130 may convert effect data called by the memory 120 into an audio signal according to an analog audio signal or audio communication standard (e.g., I2S). The audio signal may be an analog audio signal or may be configured by data according to a known audio communication standard.

The haptic signal may include at least one of an amplitude, a frequency and a duration of the vibration of the actuator 150. Meanwhile, the haptic signal is also converted into the analog audio signal or an audio signal type according to the audio communication standard, and stored to more effectively perform processing and conversion of data, and more smoothly combine the haptic effect data and the audio effect data.

The plurality of effect data stored in the memory 120 may include the haptic data, the audio data, and the combination data in which the haptic data and the audio data are combined in advance. At this time, the haptic data, the audio data, and the combination data may be encoded to audio type data, and stored.

The combination data may be generated by sequentially combining the haptic data and the audio data in order. Alternatively, the combination data may be generated by mixing the haptic data and the audio data to be overlapped.

Figure 3:
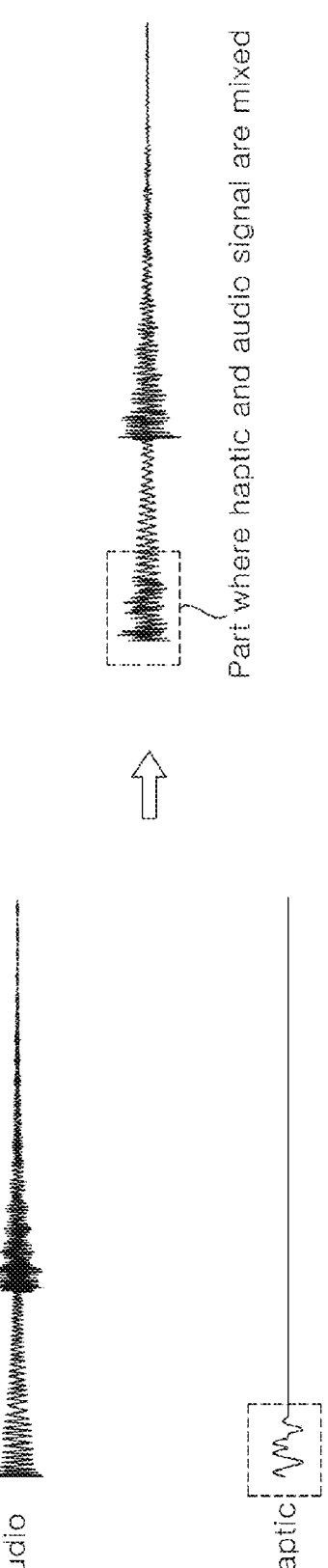
FIGS. 3 and 4 are diagrams referenced for a description of data combination according to an embodiment of the present disclosure.
Figure 4:
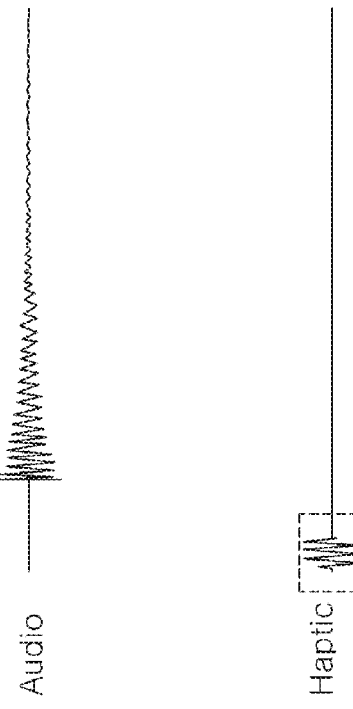

FIGS. 3 and 4 are diagrams referenced for a description of data combination according to an embodiment of the present disclosure.

FIG. 3 illustrates an example in which the haptic and the audio are mixed and combined. Referring to FIG. 3, when a haptic having a predetermined length (e.g., 50 ms) or more is output simultaneously with the audio, the audio and haptic data are mixed to be overlapped to create and store in an audio data format.

FIG. 4 illustrates an example in which the haptic and the audio are sequentially combined. Referring to FIG. 4, in the case of a short haptic signal within a predetermined length (e.g., 50 ms), the haptic may be first transmitted, and the audio may be transmitted later. The reason is that a haptic operation time is short, and it is recognized that the haptic and the audio are simultaneously output emotionally.

The audio data and the haptic data are stored in the memory 120, and the processor 130 calls data corresponding to the touch input 111, and decoding-processes the called data, and delivers the decoded data to the speaker amplifier 140. The signal amplified by the speaker amplifier 140 is input into the actuator 150, and the actuator 150 outputs the audio or haptic according to the input signal.

When the audio data and the haptic data are simultaneously output, the audio data and the haptic data are combined and created in advance in the form of the audio data, and stored in the memory 120.

ven in this case, the processor 130 calls data corresponding to the touch input, and decodes the data, and delivers the decoded data to the speaker amplifier 140. The signal amplified by the speaker amplifier 140 is input into the actuator 150, and the actuator 150 outputs the audio and the haptic according to the input signal.

When each of the audio data and the haptic data is converted and combined, sound and/or vibration may be distorted during a combination process. Processing frequency characteristics of data synthesized in advance according to the type of output effect and a frequency band has an advantage of being capable of providing the high-quality audio and haptic without further distortion.

In some embodiments, the processor 130 calls the effect data matched with the touch input 111 through the touch panel 110 from the memory 120, and the speaker amplifier 140 amplifies the signal based on the audio signal output by the processor 130, and outputs the amplified signal to the actuator 150.

The actuator 150 outputs at least one of the audio 170 and the haptic 160 based on the output signal of the speaker amplifier 140.

According to an embodiment of the present disclosure, the frequency of the signal input into the actuator 150 is appropriately controlled according to the output to prevent damage to the actuator and enhance the life-span of the actuator. Frequency characteristic conversion 135 may be performed by the processor 130. Alternatively, the frequency characteristic conversion 135 may be performed by the speaker amplifier 140.

The processor 130 or the speaker amplifier 140 converts and outputs the frequency characteristics of the audio signal when the effect data matched with the touch input 111 through the touch panel 100 includes the audio data.

The processor 130 or the speaker amplifier 140 converts the frequency characteristics of the audio signal according to different frequency conversion logics when the actuator 150 outputs both the audio and the haptic, and when the actuator 150 outputs only the audio.

For example, the processor 130 or the speaker amplifier 140 converts the frequency characteristics of the audio signal by increasing a gain only in an audio region frequency band predetermined in a voice guidance or button sound when the actuator 150 outputs an audio and a haptic of the voice guidance or button sound.

Further, the processor 130 or the speaker amplifier 140 converts the frequency characteristics of the audio signal by increasing the gain only in the audio region frequency band predetermined in the voice guidance or button sound to larger than the gain in the haptic frequency domain when the actuator 150 outputs the audio and the haptic of the voice guidance or button sound.

Further, the processor 130 or the speaker amplifier 140 converts the frequency characteristics of the audio signal by applying a first gain in a first frequency in the audio region frequency band predetermined in the voice guidance or button sound and applying a second gain larger than the first gain in a second frequency larger further to a resonance frequency of the actuator 150 than the first frequency when the actuator 150 outputs the audio and the haptic of the voice guidance or button sound.

Further, the processor 130 or the speaker amplifier 140 converts the frequency characteristics of the audio signal by amplifying the audio region frequency band predetermined in the voice guidance or button sound when the actuator 150 outputs only the audio of the voice guidance or button sound.

Further, the processor 130 or the speaker amplifier 140 converts the frequency characteristics of the audio signal by attenuating a predetermined range of frequency band at the resonance frequency of the actuator 150, and amplifying a frequency band of at least some among other regions when the actuator 150 outputs only the music-type audio.

Meanwhile, the processor 130 or the speaker amplifier 140 does not convert the frequency characteristics of the audio signal, or converts the frequency characteristics of the audio signal by increasing a region which deviates from a predetermined range of frequency band in the resonance frequency of the actuator 150, when the actuator 150 outputs only the haptic.

According to an embodiment of the present disclosure, the processor 130 or the speaker amplifier 140 may convert the frequency according to different frequency conversion logics when the actuator outputs only the haptic and when the actuator 150 outputs both the haptic and the audio, and the speaker amplifier 140 may amplify a signal of which frequency is converted.

Meanwhile, the actuator 150 may be even smaller than the touch panel 110. In this case, when the actuator 150 for the haptic output vibrates, a touch sense will be felt weaker as being further from the actuator 150. Accordingly, when the actuator 150 vibrates with the same strength, it is more difficult for the user to feel the haptic effect when the user touches a region/button far from the actuator 150 than when touching a region/button close to the actuator 150.

According to an embodiment of the present disclosure, the processor 130 or the speaker amplifier 140 may convert and output the frequency characteristics of the audio signal so that the vibration of the actuator upon the touch input into a second region positioned further from the actuator 150 than a first region is larger than the vibration of the actuator upon the touch input into the first region in the touch panel 110. As a result, the user may feel a constant touch sense regardless of the touch region.

In some embodiments, the processor 130 calls at least one of the audio data and the haptic data matched with the touch input 111 through the touch panel 110 from the memory 120, and converts the called data into the audio signal, and the speaker amplifier 140 amplifies the signal based on the audio signal output by the processor 130, and outputs the amplified signal to the actuator 150.

According to the embodiments of the present disclosure, one actuator 150 is combinationally used for reproducing the haptic 160 and the audio 170. The audio signal and the haptic signal are stored in the memory 120, and processed in the form of the audio signal through the processor 130 such as a micom unit (MCU0, an application processor (AP), etc., and input and output into the speaker amplifier 140.

When the haptic signal and the audio signal should be simultaneously output, the haptic signal and the audio signal are combined in the form of the audio data, and stored in the memory 120, and processed in the same process under a corresponding situation.

The haptic and audio combined actuator 150 should be designed so that attenuation is gentle at a frequency equal to or higher than the resonance frequency. In order to make the frequency attenuation to be gentle, a vibration generation element k (stiffness) should be low. To this end, it is preferable to select and use the actuator 150 using the material such as rubber.

Figure 5:
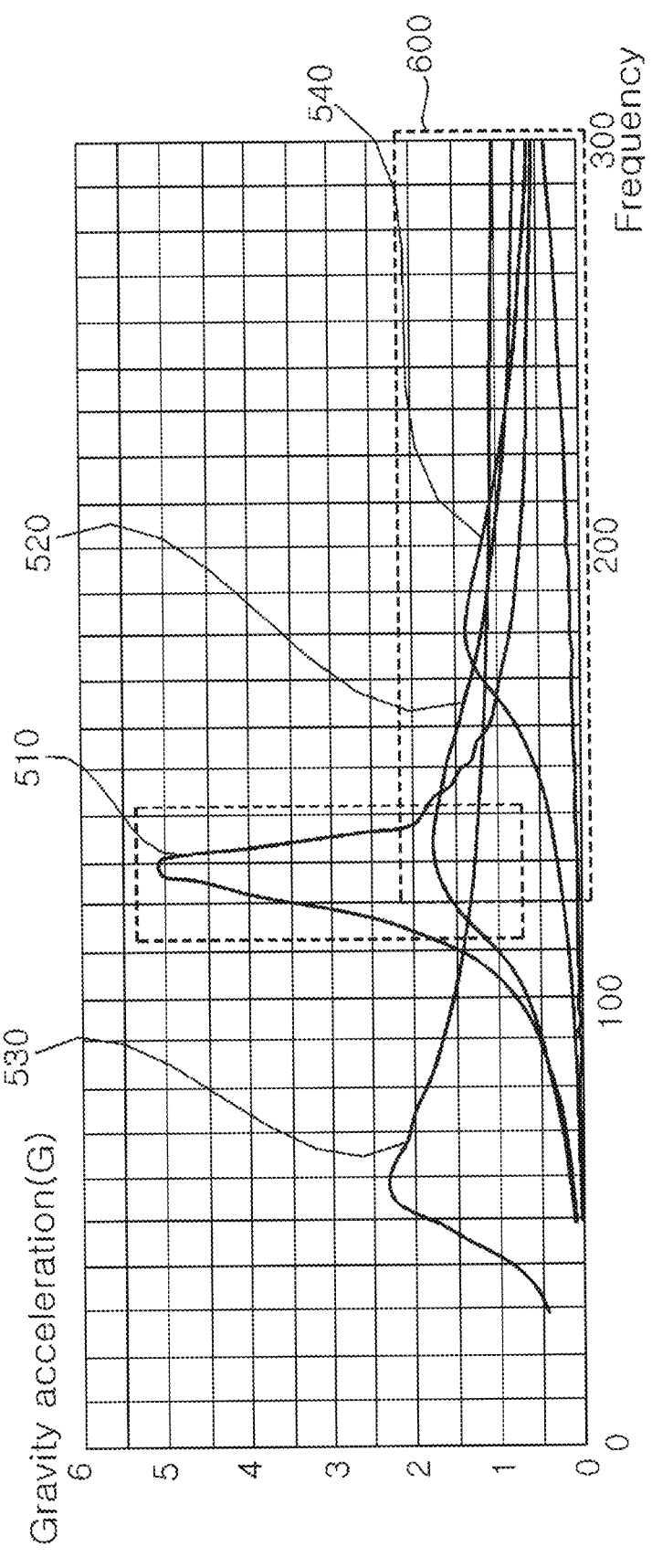
FIGS. 5 and 6 are diagrams referenced for a description of frequency characteristics of an actuator according to an embodiment of the present disclosure.
Figure 6:
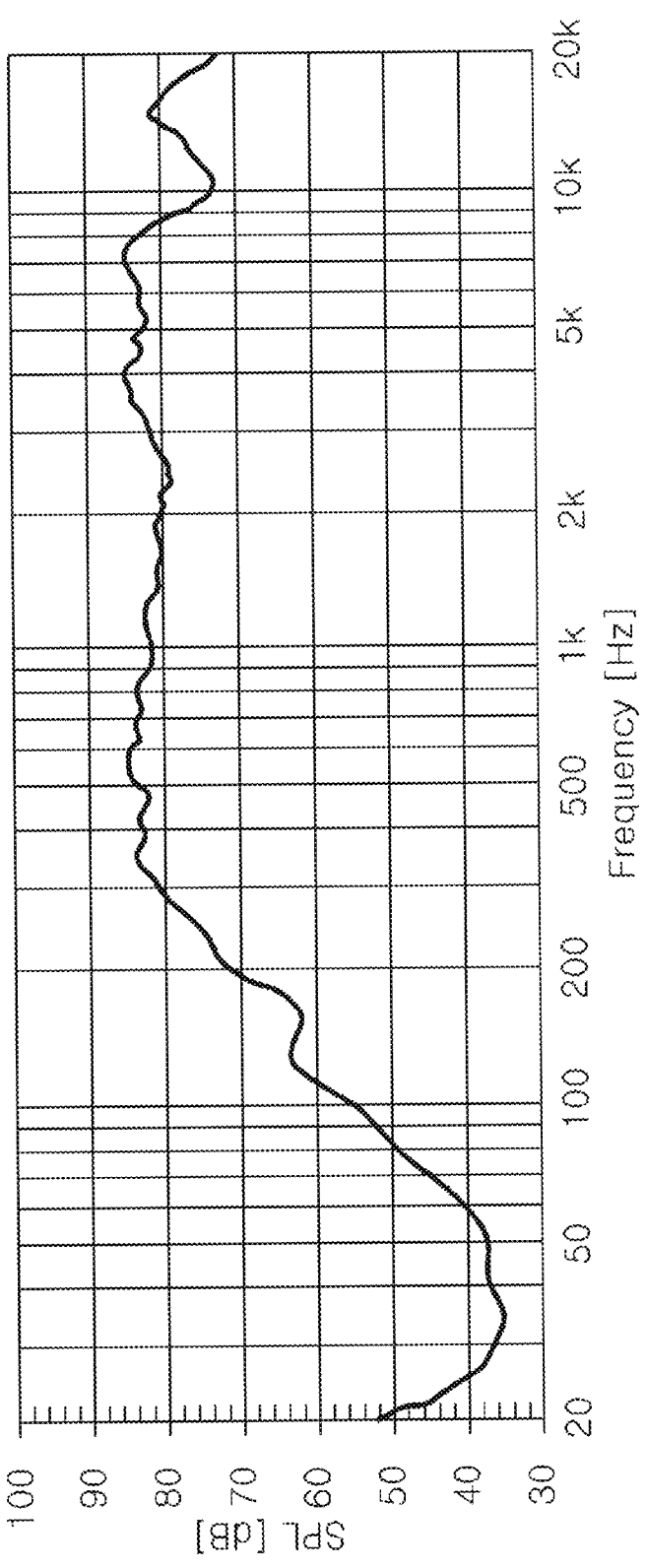

FIGS. 5 and 6 are diagrams referenced for a description of frequency characteristics of an actuator according to an embodiment of the present disclosure. FIG. 5 illustrates frequency characteristics of various actuators 510, 520, 530, and 540, and FIG. 6 illustrates a frequency-specific sound pressure level (SPL) of a selected actuator 520.

In the case of a haptic dedicated actuator 510, a metal spring material having high stiffness (k) is generally used. In order to use the actuator for the haptic and the audio combinationally, the resonance of the actuator should be formed in a haptic operation frequency range. Referring to FIGS. 5 and 6, a resonance frequency for implementing the haptic performance in the home appliance is in the range of 100 to 200 Hz.

At a resonance frequency 530 less than 100 Hz, a haptic sense is emotionally heavy, and a vibration displacement amount is large, so the inter-part collision is highly likely to occur in the product. When a resonance frequency 540 equal to or higher than 200 Hz is applied for the haptic in the home appliance, an unintentional sound is also jointly generated simultaneously with haptic vibration. Accordingly, it is preferable to select an actuator 520 in which the resonance is positioned in a haptic operation frequency, and the attenuation is gentle at a subsequent frequency.

In order to use the actuator for the haptic and the sound combinationally, the resonance of the actuator should be formed in the haptic operation frequency range, and the attenuation should be gentle at a frequency equal to or higher than the resonance frequency. When the attenuation is made too rapidly, it is difficult to use the actuator for the sound. To this end, among the vibration elements of the actuator, the stiffness should be low. To this end, it is more preferable to use a material (e.g., rubber series) having low stiffness (k) in the spring element of the actuator.

Meanwhile, the vibration attenuation should be gentle at the frequency equal to or higher than the resonance frequency to show a sufficient audio output performance. The vibration attenuation should be gentle, it is possible to implement frequency characteristics full range speaker illustrated in FIG. 6 by supplementing a frequency band having an insufficient performance through a frequency control algorithm. When the vibration attenuation is made too rapidly, a volume should be very higher in an audio AMP, and a frequency-specific sound volume is not balanced, so it is difficult to apply the actuator for the audio.

According to the embodiment of the present disclosure, the frequency control algorithm is applied to use the actuator 150 for the haptic and the audio combinationally. The operation frequency band of the haptic or the audio is compensated and attenuated through the frequency control algorithm to implement a performance suitable for each function.

Figure 21:
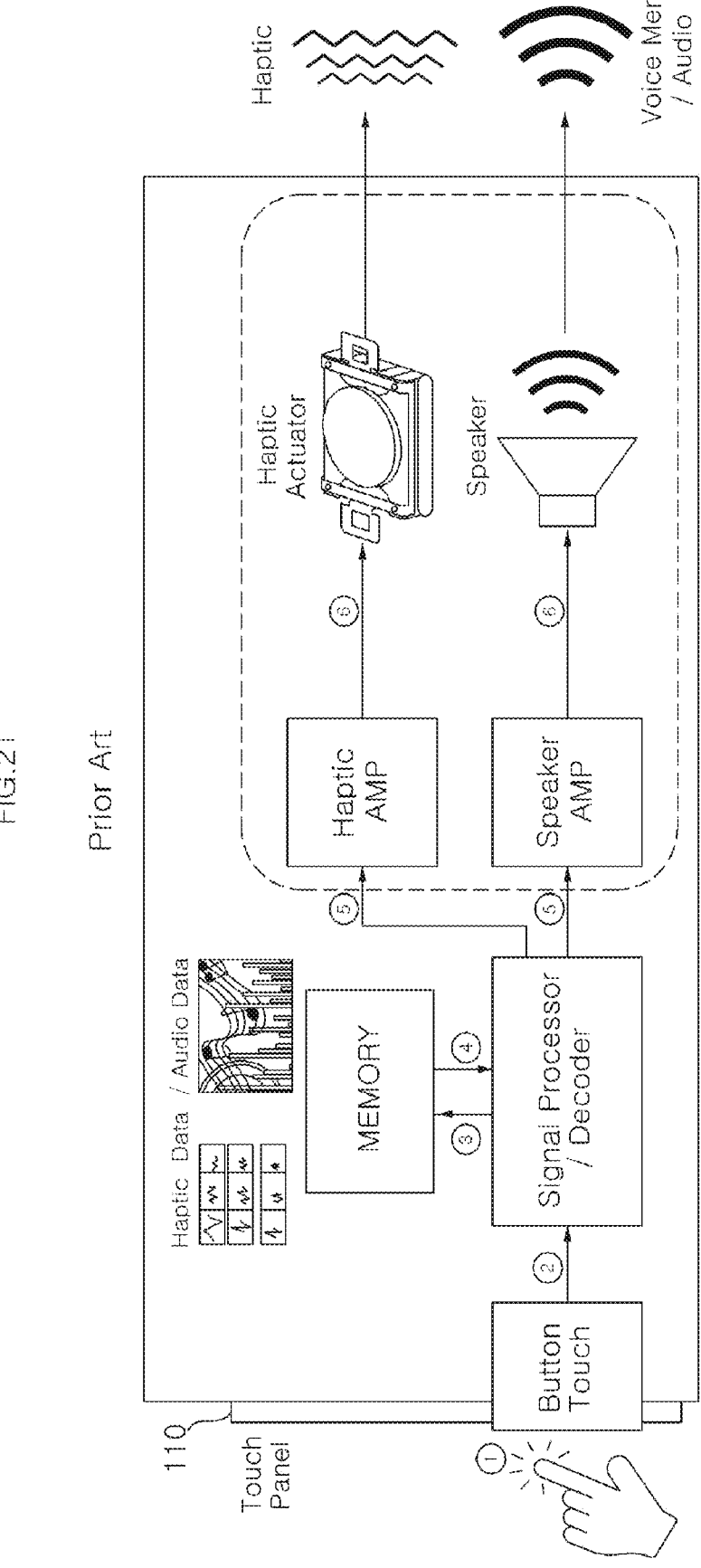
FIGS. 21 and 22 are diagrams referenced for an audio haptic output apparatus using an actuator in related art.
Figure 22:
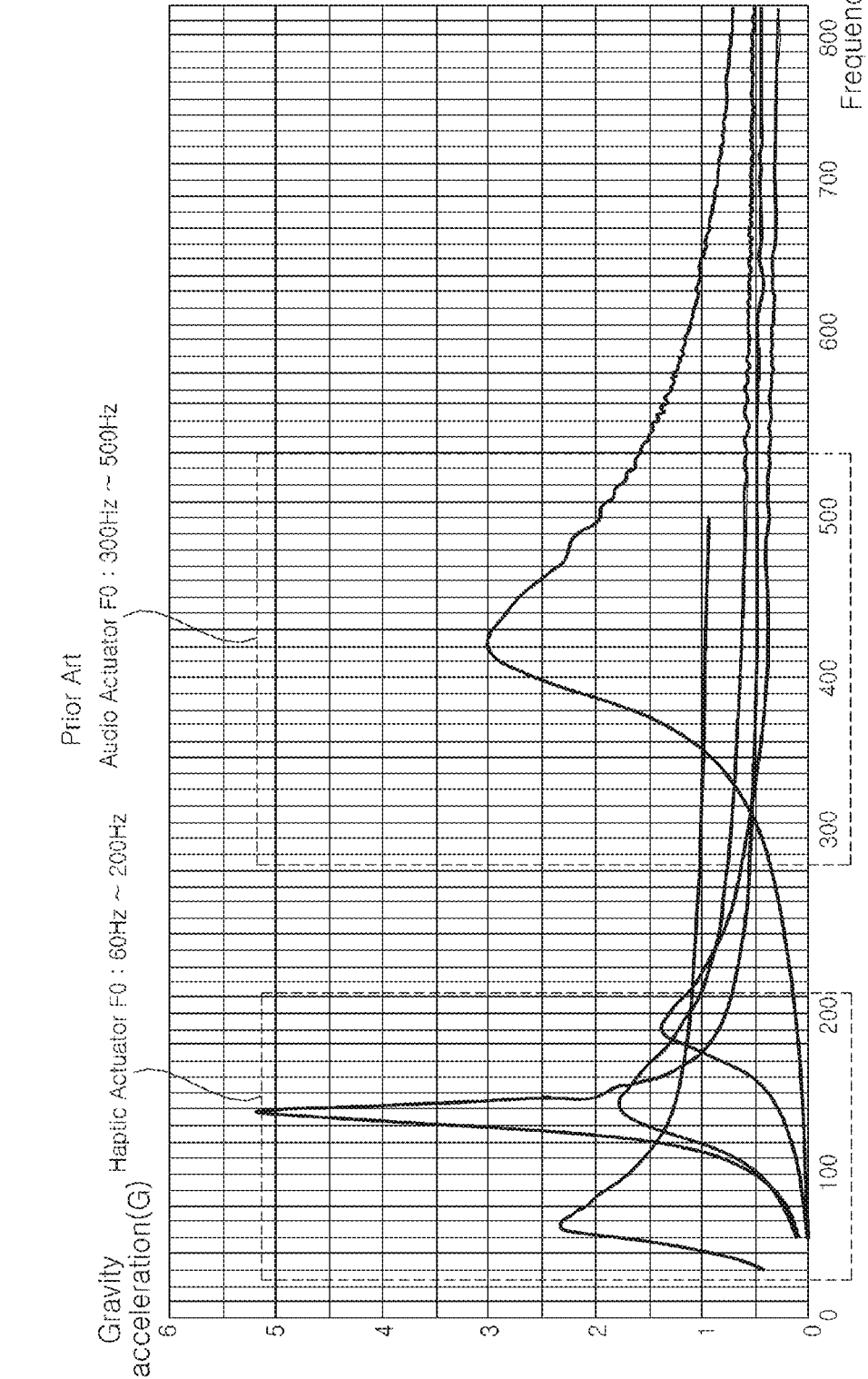

When FIG. 2 and FIG. 21 are compared, functions of a haptic driver and a speaker amplifier are integrated into one speaker amplifier 140, and used, and a haptic actuator and a speaker are also implemented as one actuator 150.

Referring to FIG. 2, when the user touches a specific operation button of the touch panel 110, touch operation button data is delivered from the memory 120 to the processor 130.

The memory 120 stores haptic data and audio data matched with each touch operation button. The haptic data is stored as an audio data format. Further, when the haptic data and the audio data are simultaneously output in a specific button operation, the haptic data and the audio data are combined, and stored as one data (audio data format).

The processor 130 loads haptic/audio data corresponding to the button touched by the user from the memory 120. The processor 130 may decode the loaded haptic/audio data in a format of an audio signal (I2S or analog audio). For example, integrated interchip sound (I2S) may be a communication protocol for transmitting and receiving the audio data, and may include audio file formats such as Wave, MPEG Layer-3 (mp3), etc.

In respect to the decoded haptic/audio signal, frequency characteristics are converted through a frequency characteristic conversion algorithm 135. The frequency characteristic conversion algorithm 135 may also be executed by the processor 130. Alternatively, when the speaker amplifier 140 has a built-in digital signal processor (DSP) embedded therein, the frequency characteristic conversion algorithm 135 may also be processed by the speaker amplifier 140.

The haptic/audio signal of which frequency characteristics are converted are amplified by the speaker amplifier 140, and the amplified haptic/audio signal is delivered and output to the actuator 150.

The actuator 150 is attached to the touch panel 110 or an instrument to generate sound and vibration by using the touch panel or the instrument as a vibration plate. The processor 130 or the speaker amplifier 140 may control the actuator 150 to vibrate at a predetermined frequency for a predetermined time. With the vibration of the actuator 150, only the sound may be output, the haptic may be output, or both the sound and the haptic may be output.

According to an embodiment of the present disclosure, the operation frequency band of the haptic or the audio is compensated and attenuated through the frequency characteristic conversion algorithm 135 to implement a performance suitable for each function. There are various combinations of the feedback effect output by the home appliance 10, and output feedback effects have different operation frequency band characteristics, so frequency control for each case is required.

Figure 7A:
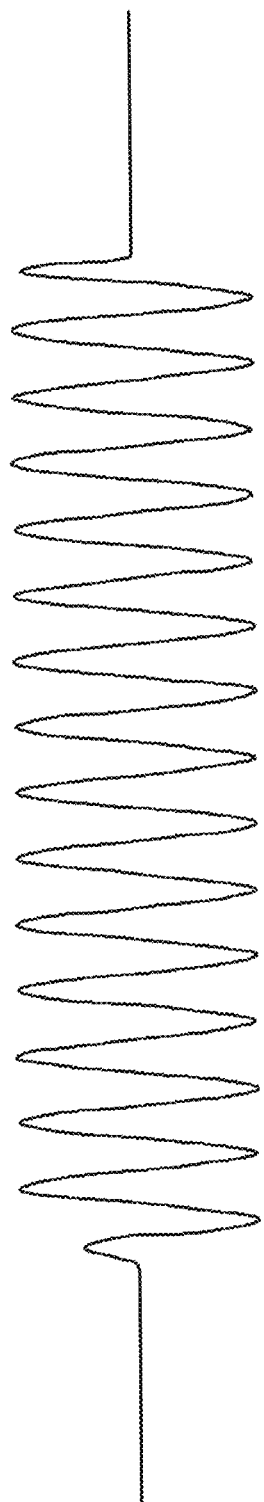
FIGS. 7A and 7B are a diagram illustrating a haptic waveform.
Figure 7B:
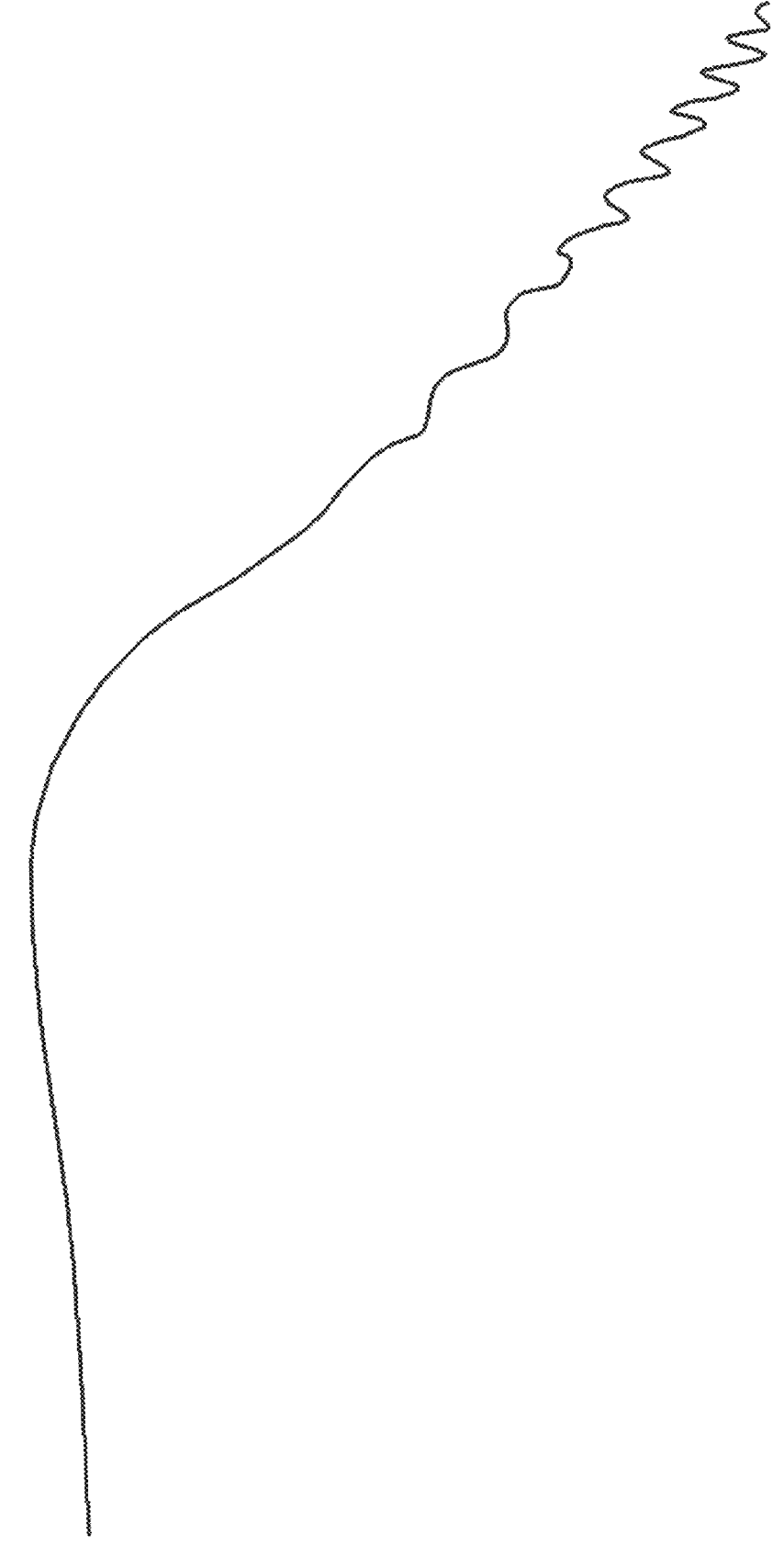

FIGS. 7A and ZB are a diagram illustrating a haptic waveform, and FIG. 7A illustrate the haptic waveform along a time axis (X axis) and FIG. 7B illustrates the haptic waveform along a frequency axis (X axis). Referring to FIGS. ZA and 7B, as a frequency band that generates the vibration effect, a frequency less than 200 Hz is used. A haptic frequency may be generated around the actuator resonance, and for example, the haptic frequency may be 180 Hz.

Figure 8A:
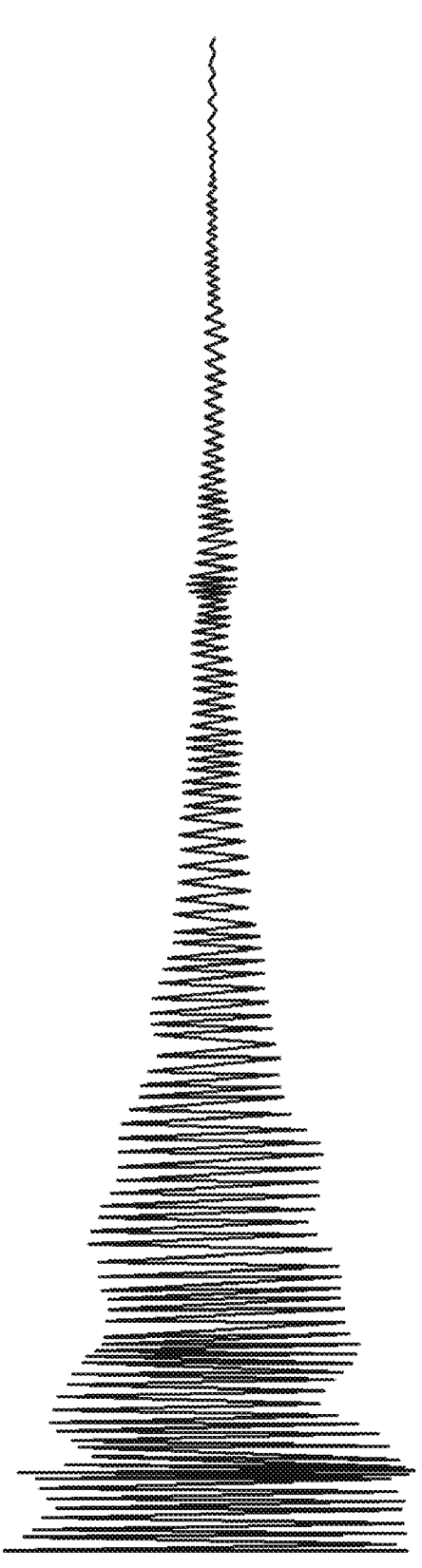
FIGS. 8A and &B are a diagram illustrating a button sound waveform.
Figure 8B:
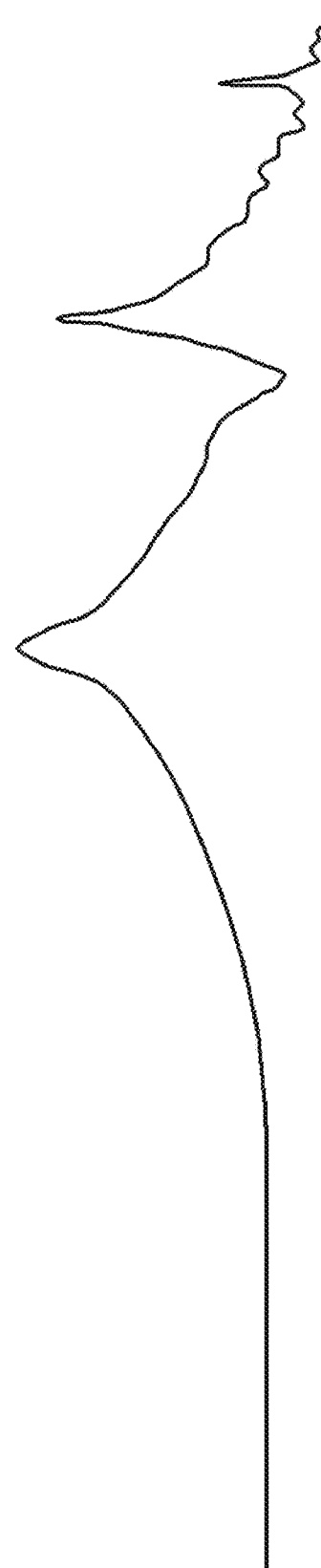

FIGS. 8A and 88 are is a diagram illustrating a button sound waveform, and FIG. 8A illustrate the button sound waveform along the time axis (X axis) and FIG. 8B illustrates the button sound waveform along the frequency axis (X axis). Since the button sound is a simple button sound for notification, a single tone is primarily used or multiple single tones are combined, and in general, a frequency band of 500 Hz or higher is used. Referring to FIGS. 8A and 8, the button sound may be formed in the form of the single tone at 700 Hz and 3 KHz, and this does not overlap with the haptic operation frequency.

Figure 9A:
FIGS. 9A and 9B are a diagram illustrating a voice guidance ment waveform.
Figure 9B:
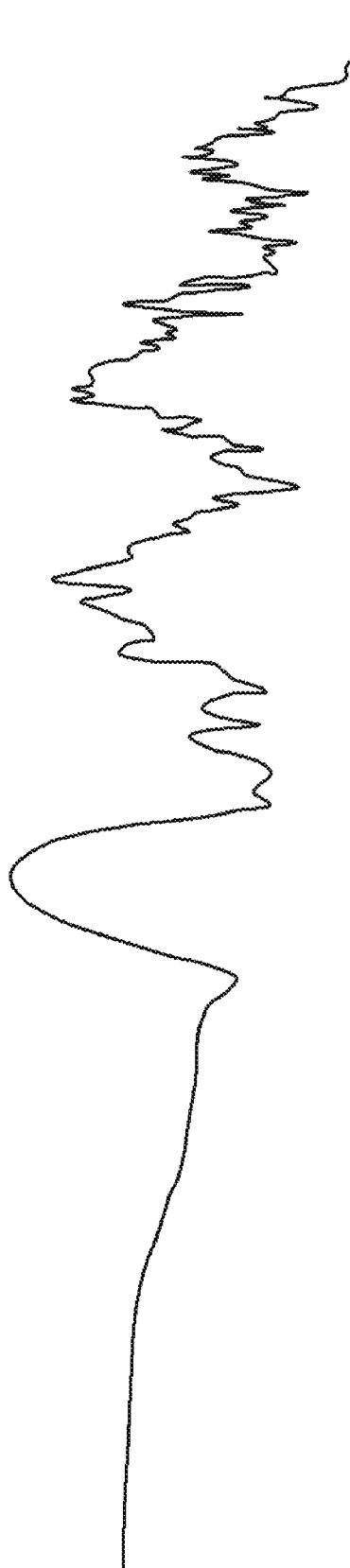

FIGS. 9A and 9B are is a diagram illustrating a voice guidance ment waveform, and FIG. 9A illustrate the voice guidance ment waveform along the time axis (X axis) and FIG. 9B illustrates the voice guidance ment waveform along the frequency axis (X axis). In respect to the voice guidance ment, a high-tone voice having excellent articulation may be used as the voice guidance ment. Referring to FIGS. 9A and 9, in the case of the voice guidance met waveform, energy concentrates on a frequency band of 200 HZ to 1 KHz. FIGS. 9A and 9 illustrates a voice guidance ment frequency of 200 Hz or higher, and the haptic frequency and the voice guidance ment frequency may partially overlap on a boundary, but a boundary region is a part having small energy, so the boundary region may be regarded as a separated frequency domain.

Figure 10A:
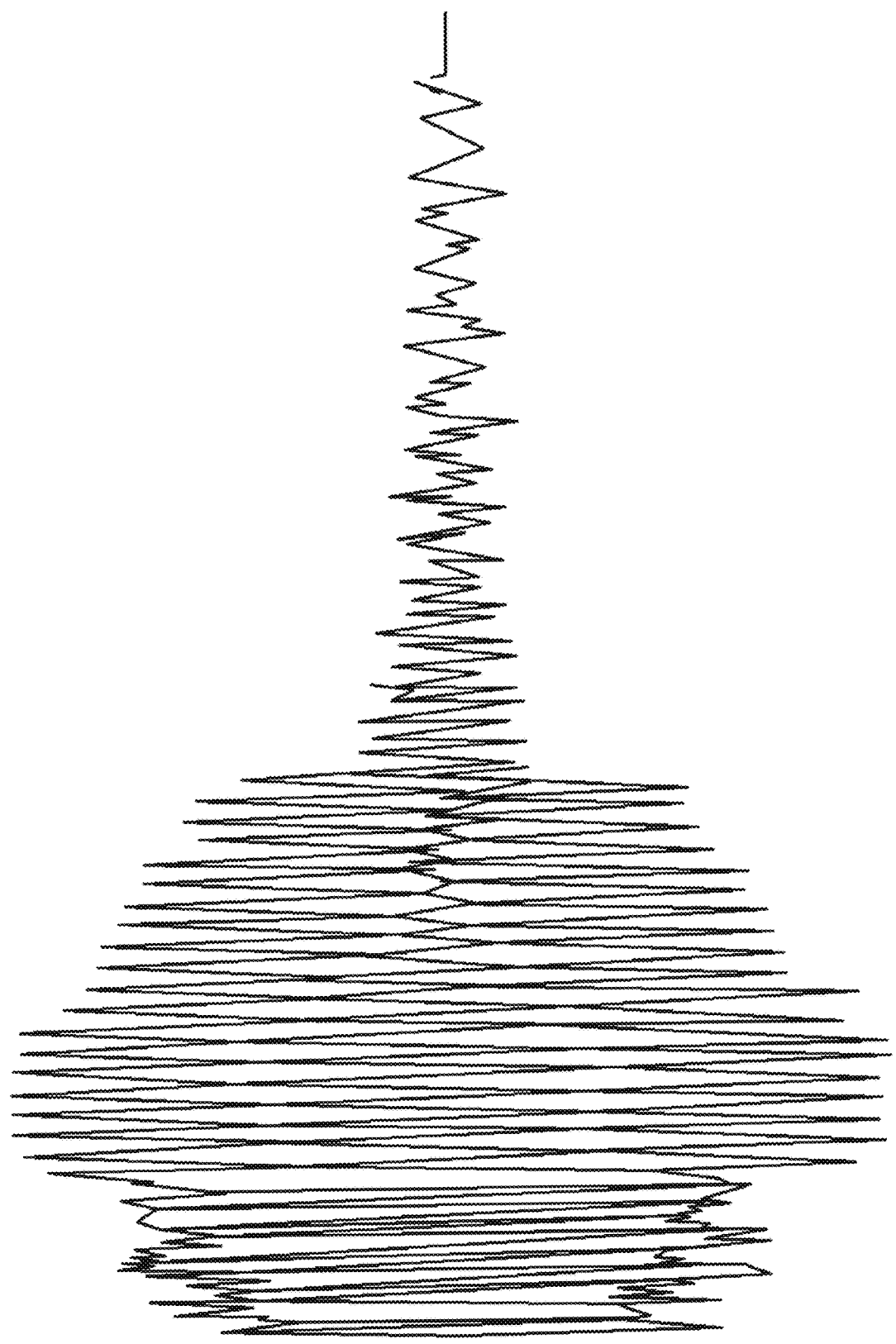
FIGS. 10A and 10B are a diagram illustrating and haptic and the button sound waveform.
Figure 10B:
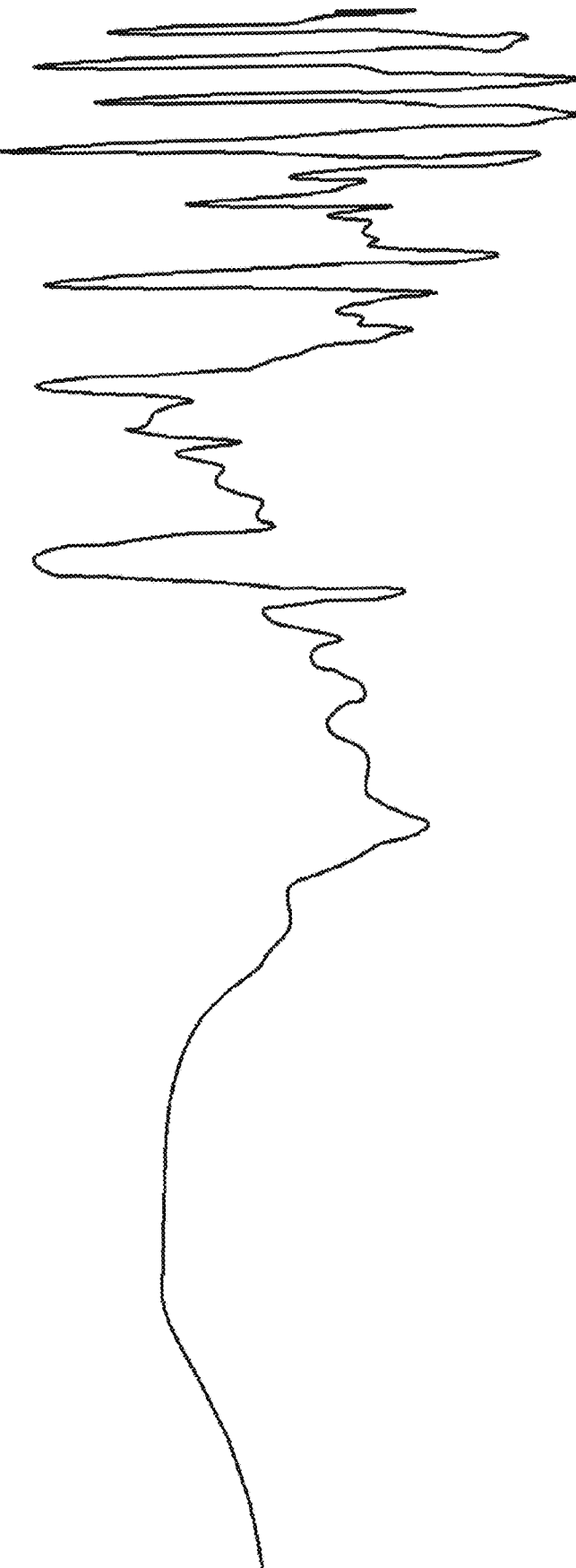

FIGS. 10A and 10B are diagram illustrating haptic and button sound waveforms, and FIG. 10A illustrate a waveform in which the haptic and the button sound are combined along the time axis (X axis) and FIG. 10B illustrates the waveform in which the haptic and the button sound are combined along the frequency axis (X axis). In order to simultaneously output the button sound (or voice guidance ment) and the haptic, when the button sound (or voice guidance ment) and the haptic are combined, the button sound (or voice guidance ment) and the haptic have different operation frequency bands, so the button sound (or voice guidance ment) and the haptic may be separated and transmitted. Referring to FIGS. 10A and 10, when the haptic and the button sound are combined, the frequency bands are separated, and the operation frequencies of both signals do not overlap.

Figure 11A:
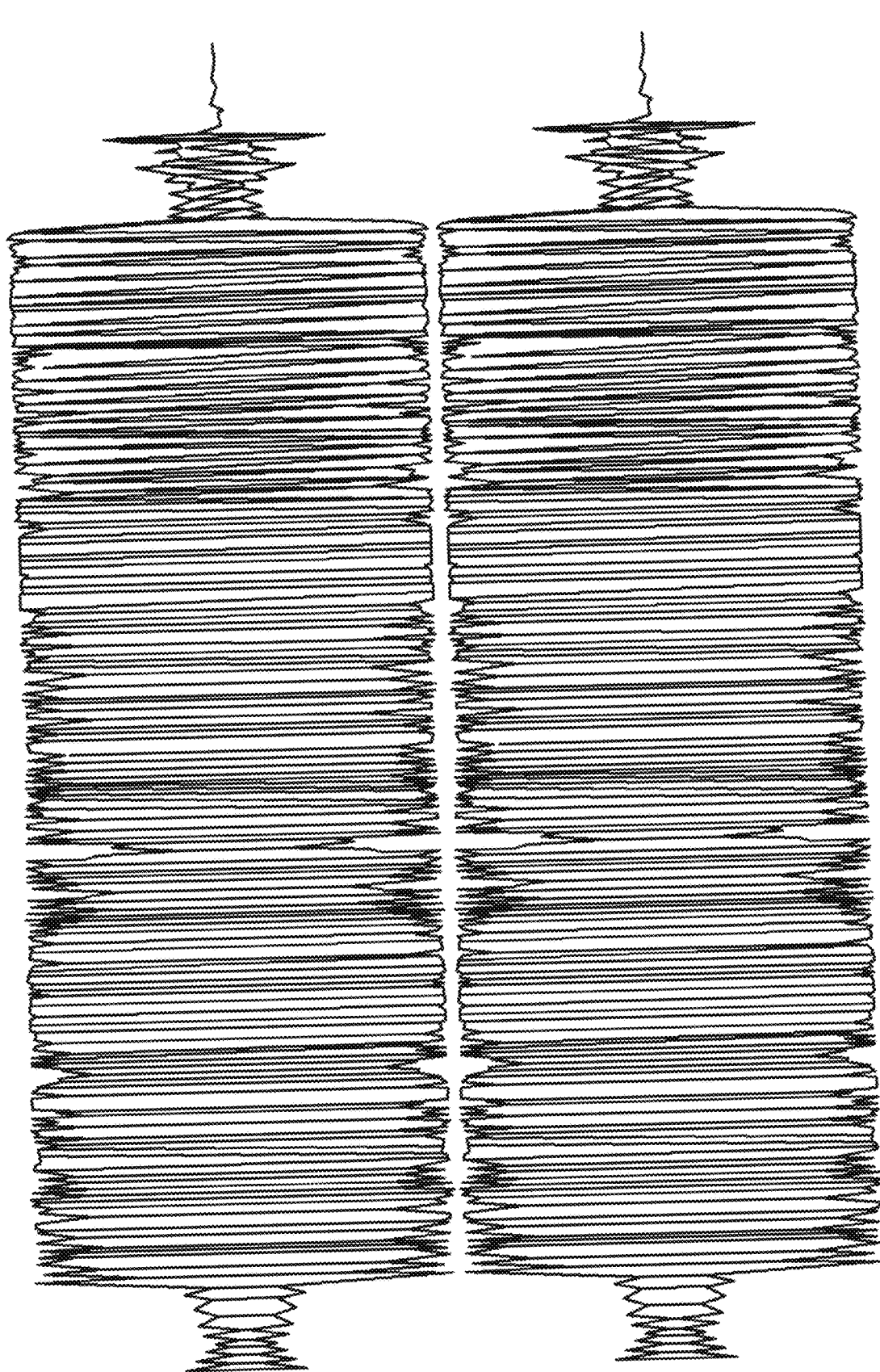
FIGS. 11A and 11B are a diagram illustrating a music sound source waveform.
Figure 11B:
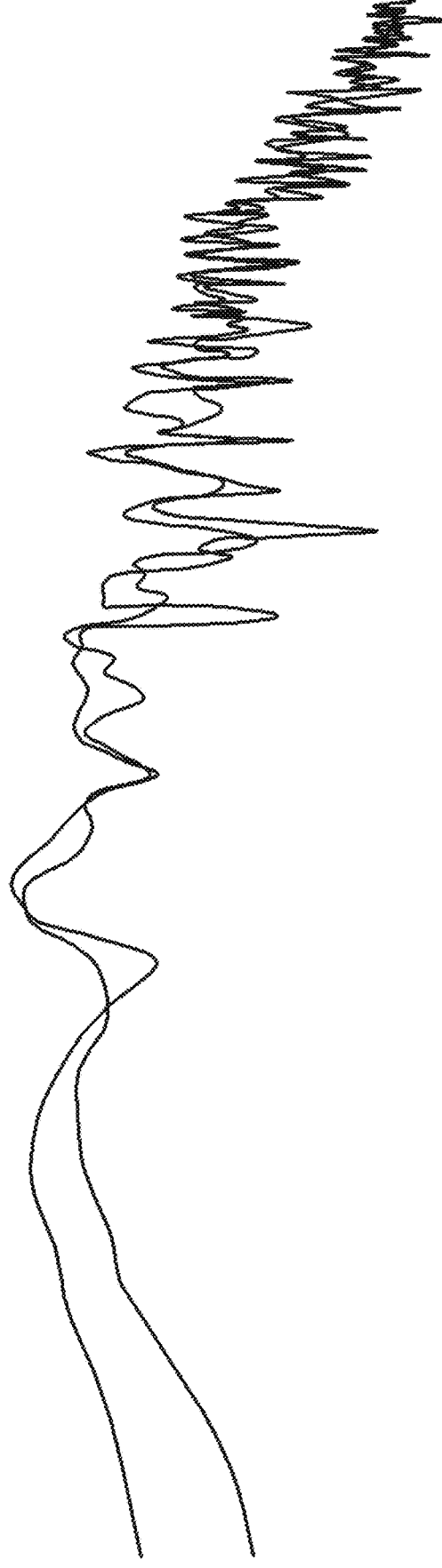

FIGS. 11A and 11B are a diagram illustrating a music sound source waveform, and FIG. 11A illustrate the music sound source waveform along a time axis (X axis) and FIG. 11B illustrates the music sound source waveform along a frequency axis (X axis). Since a used frequency range of the music is determined according to the type of instrument used, a whole audio frequency may be regarded as an operation range during the music output, and an operable range of the actuator is at a level of 50 Hz to 10 KHz. FIGS. 11A and 11B illustrates a music sound source frequency, and a wide frequency band is formed, which includes a resonance frequency band of the actuator of 50 Hz or higher.

Figure 12:
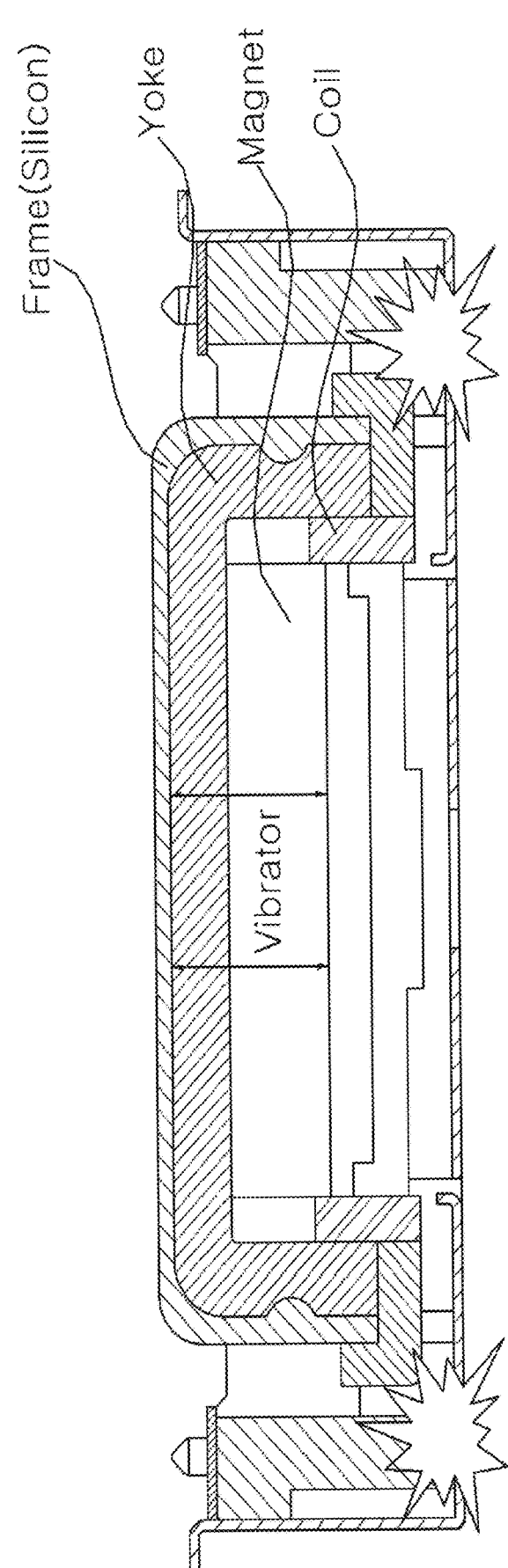
FIGS. 12 and 13 are diagrams illustrating a collision by actuator vibration.
Figure 13:
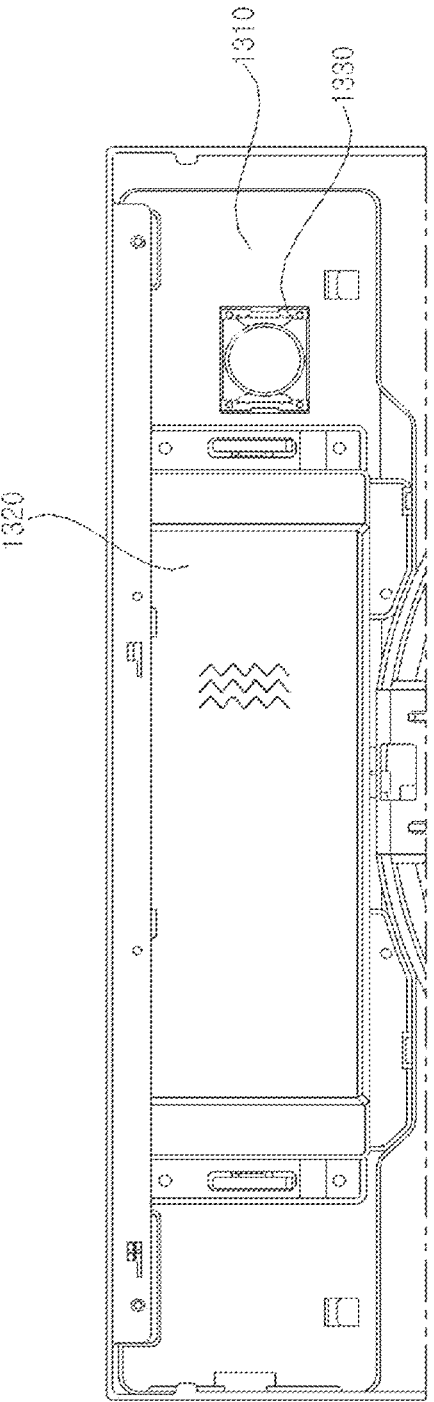

FIGS. 12 and 13 are diagrams illustrating a collision by actuator vibration. FIG. 12 is a cross-sectional view of an actuator illustrating a collision at a resonance frequency of the actuator, and FIG. 13 illustrates a case where an actuator 1330 accommodated in a housing 1320 vibrates a panel 1310 such as a touch panel, a display panel, etc.

Referring to FIG. 12, vibration may be generated by using electromagnetic force between a magnet and a coil (yoke). The actuator converts the electromagnetic force into mechanical driving force to allow a vibrator to vibrate vertically.

Meanwhile, the actuator of FIG. 12 is an exemplary, and the present disclosure is not limited to the type of actuator. For example, a piezoelectric actuator, a linear resonant actuator), an electro-active polymer actuator, etc., may be used.

Referring to FIG. 12, at the resonance frequency of the actuator, when an input signal is too large, a vibrator displacement amount exceeds the operation range, so a collision may occur while the vibrator hits an external housing of the actuator.

When the music is played around the resonance frequency of the actuator, the actuator vibrator may deviate from a vibration displacement range as in an example of FIG. 12. In this case, while the external housing of the actuator and the vibrator or a part combined with the vibrator collides with the external housing of the actuator, noise may be generated.

Referring to FIG. 13, due to excessive vibration of the panel 1310 at the resonance frequency of the actuator, the actuator 1330 may collide with a housing 1320 combined with the panel 1310 or the actuator 1330 may collide with another part combined with the panel 1310.

As in an example of FIG. 13, when a vibration amount at which the actuator 1330 vibrates the panel 1310 is too large, a collision due to vibration may occur in a product. Accordingly, vibration control is required at an actuator resonance frequency.

As described with reference to FIGS. 7 to 13, there are various combinations for output feedback effects, and the output feedback effects have different operation frequency band characteristics. Accordingly, the frequency characteristic conversion algorithm 135 according to the present disclosure compensates and attenuates the operation frequency band of the haptic or the audio to implement a performance suitable for each function.

Figure 14:
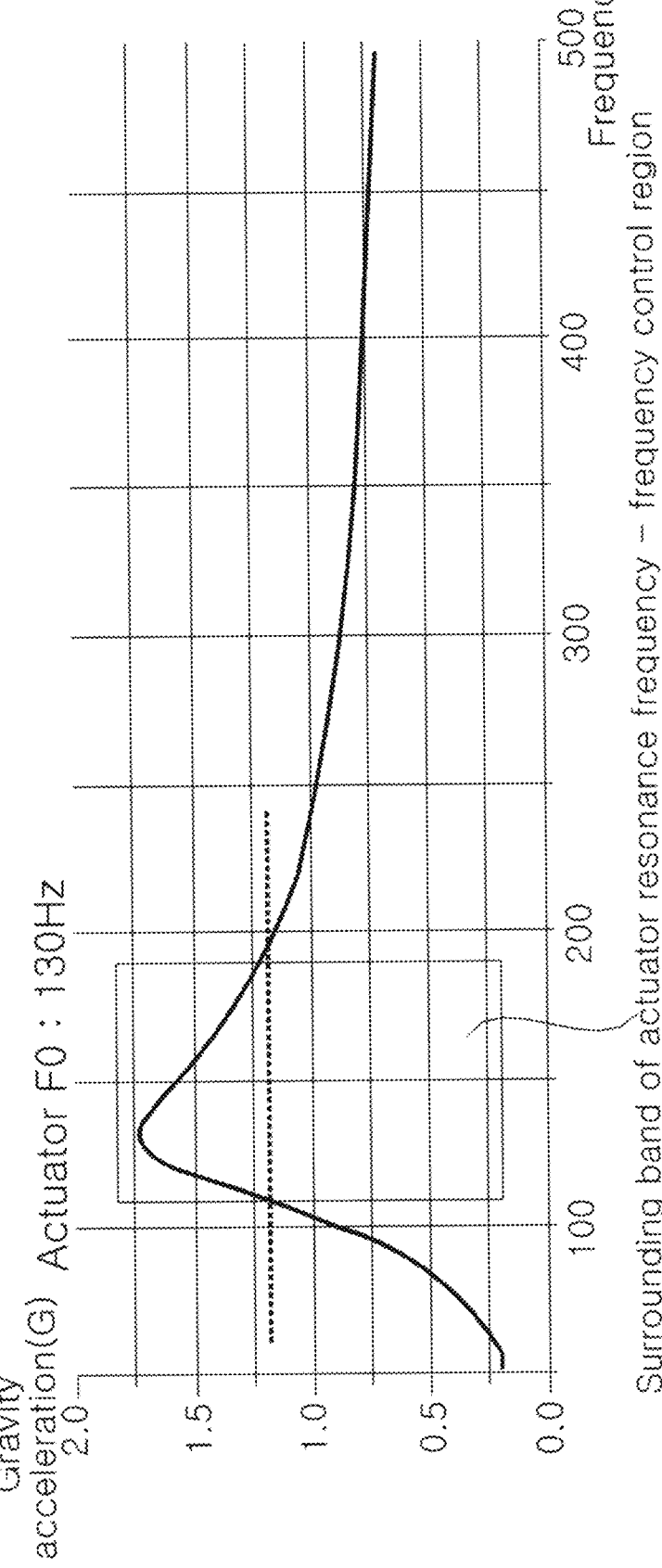
FIGS. 14 and 15 are diagrams referenced for a description of a haptic output of the audio haptic output apparatus according to an embodiment of the present disclosure.
Figure 15:
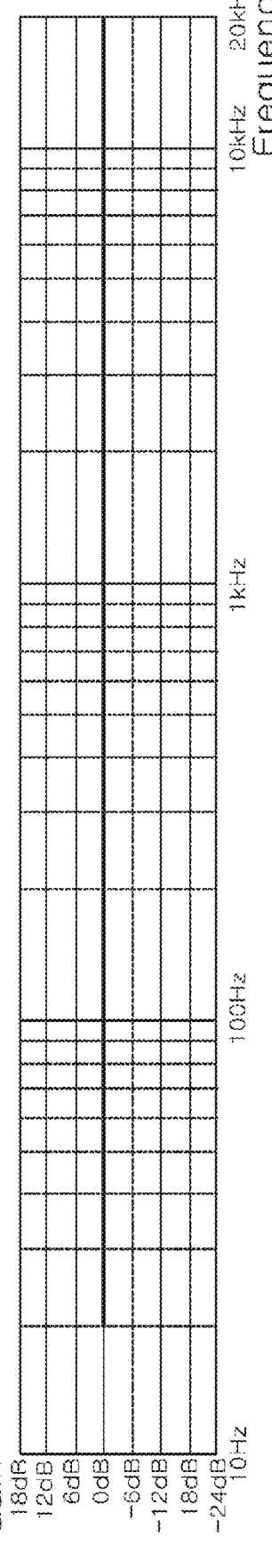

FIGS. 14 and 15 are diagrams referenced for a description of a haptic output of the audio haptic output apparatus according to an embodiment of the present disclosure, and illustrate a case of outputting only a haptic. FIG. 14 illustrates a driving region according to the frequency when only the haptic is output in a relationship between the frequency and the acceleration, and FIG. 15 illustrates a frequency characteristic conversion algorithm when only the haptic is played.

Referring to FIGS. 14 and 15, the haptic requires a vibration intensity as large as feeling vibration at a fingertip. Therefore, in a band around the actuator resonance frequency, a range around the resonance frequency of a haptic signal is a region where a gravity acceleration is reduced to less than 30% compared to the maximum performance. In FIG. 14, a resonance point 130 Hz actuator is illustrated, and in this case, the haptic signal is generated in a region of 110 Hz to 190 Hz. Meanwhile, when a range is exceeded in a high frequency band direction, vibration attenuation is severe, so very high gain setting is required, and the sound may be generated jointly unlike an intention of generating only haptic vibration.

According to an embodiment of the present disclosure, the haptic signal may be output without frequency characteristic conversion.

Alternatively, a frequency control algorithm may be applied only to the band (the region where the gravity acceleration is reduced to less than 30%).

Further, a haptic signal optimized to the resonance frequency may be set to a gain of 0 dB, and when the haptic is used in a surrounding frequency region, may be set to a gain range of ±3 dB at a corresponding frequency.

Referring to FIG. 15, when the haptic signal optimized to the resonance frequency is generated, there is no gain setting for each frequency.

When only the haptic is output, in a frequency-specific control scheme (gain setting scheme), the haptic signal optimized to the resonance frequency may be set to the gain of 0 DB (no gain setting for each frequency in FIG. 15), and the haptic signal in the surrounding band of the resonance frequency may be set to at the level of the gain of ±3 dB. In setting the gain to ±3 dB in the surrounding band, the gain of ±3 dB is a gain value required to optimize the vibration intensity to an intensity at the level of the resonance frequency.

The frequency characteristic conversion algorithm 135 may increase or decrease a signal according to a gain set for each frequency band for an input signal.

Figure 16:
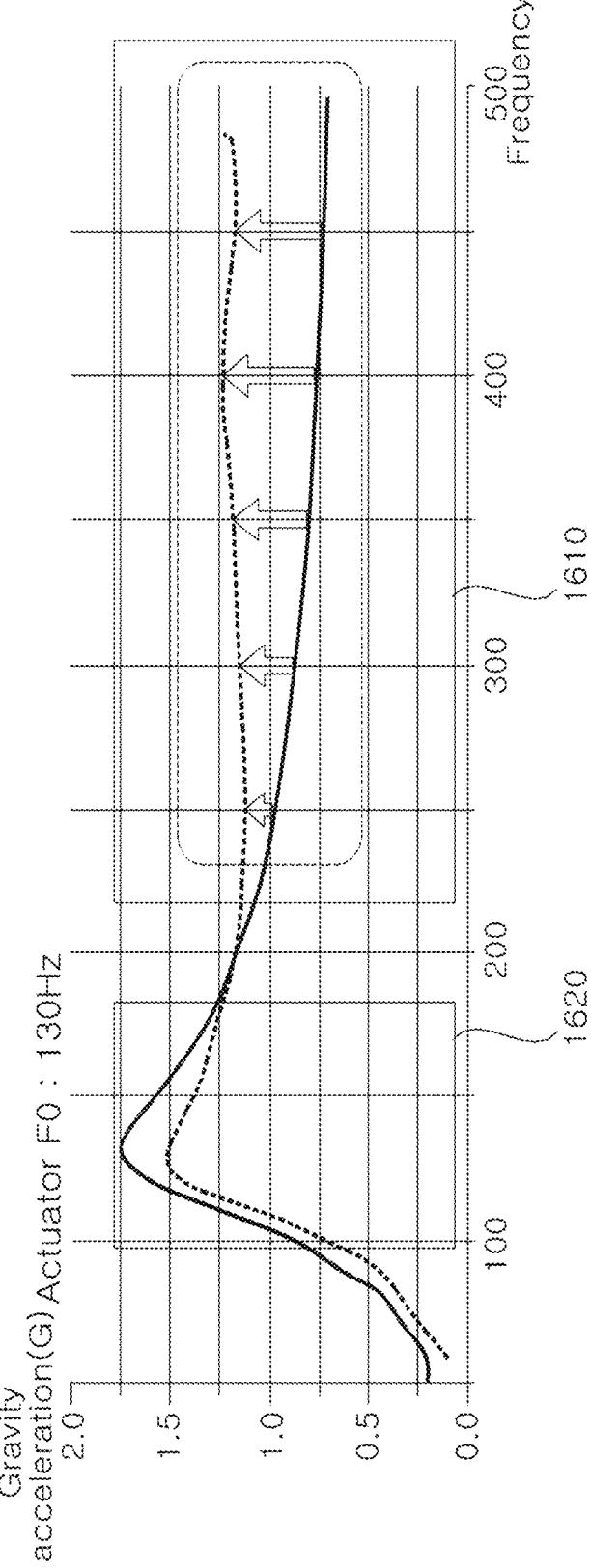
FIGS. 16 and 17 are diagrams referenced for a description of an audio haptic output of the audio haptic output apparatus according to an embodiment of the present disclosure.
Figure 17:
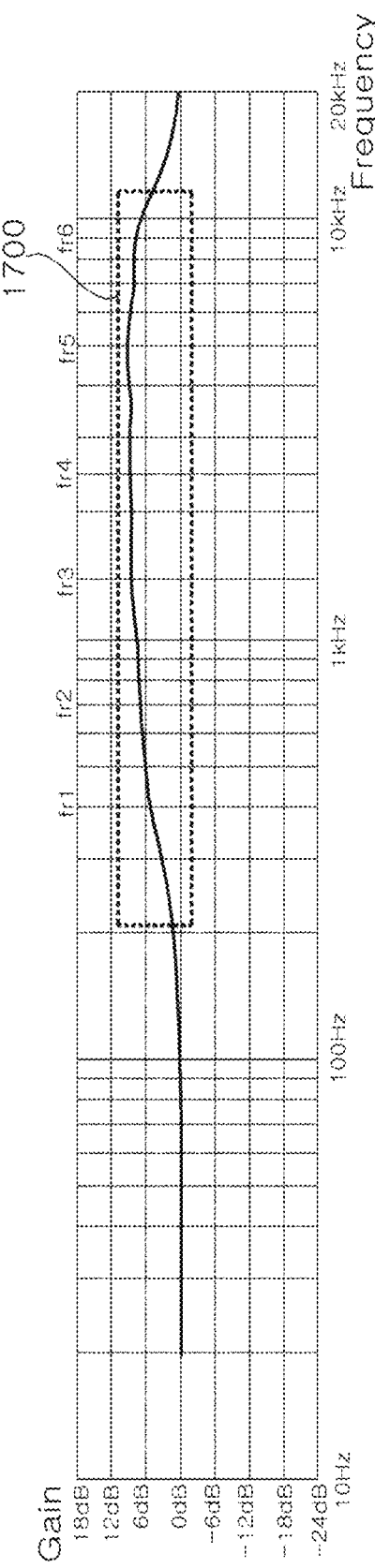

FIGS. 16 and 17 are diagrams referenced for a description of a haptic output of the audio haptic output apparatus according to an embodiment of the present disclosure, and illustrate a case of outputting the haptic and a voice guidance (or button sound). FIG. 16 illustrates a driving region according to the frequency when the haptic and the voice guidance (or button sound) are output in the relationship between the frequency and the acceleration, and FIG. 17 illustrates a frequency characteristic conversion algorithm when the haptic and the voice guidance (or button sound) are played.

Referring to FIG. 16, a frequency domain 1620 used in the haptic and a frequency domain 1610 used in the voice guidance ment (or button sound) are separated to be distinguished.

For example, the processor 130 or the speaker amplifier 140 converts the frequency characteristics of the audio signal by increasing a gain only in an audio region frequency band 1610 or 1700 predetermined in a voice guidance or button sound when the actuator 150 outputs an audio and a haptic of the voice guidance or button sound.

Alternatively, the processor 130 or the speaker amplifier 140 converts the frequency characteristics of the audio signal by increasing the gain only in the audio region frequency band 1610 or 1700 predetermined in the voice guidance or button sound to larger than the gain in the haptic frequency domain 1620 when the actuator 150 outputs the audio and the haptic of the voice guidance or button sound.

Referring to FIGS. 16 and 17, 200 Hz which is a boundary part of the haptic frequency band 1620 and the voice frequency band 1610 influences each frequency band, so the gain is not set. At 300 Hz or higher, the gain is set in order to improve the voice guidance (button sound) output performance.

Referring to FIGS. 16 and 17, when both the haptic and the voice guidance (or button sound) are output, the frequency characteristic conversion algorithm 135 increases a frequency-specific again (e.g., 5 dB or higher) in the voice guidance (button sound) region (e.g., 300 Hz or higher) 1610.

Further, in respect to the haptic, the frequency characteristic conversion algorithms 135 described with reference to FIGS. 14 and 15 may be similarly applied. For example, the haptic signal optimized to the resonance frequency may be set to a gain of 0 dB, and when the haptic is used in a surrounding frequency region, may be set to a gain range of +3 dB at a corresponding frequency.

The voice (button sound frequency band 1610 of the actuator shows larger performance attenuation as being away from the actuator resonance frequency. Accordingly, the gain may be increased by 5 dB or higher at 300 Hz or higher in order to improve the output performance.

Further, the processor 130 or the speaker amplifier 140 converts the frequency characteristics of the audio signal by applying a first gain (e.g., 5 dB) in a first frequency (e.g., fr1) in the audio region frequency band predetermined in the voice guidance or button sound and applying a second gain (E.G., 7 dB) larger than the first gain in a second frequency (e.g., fr2) larger further to a resonance frequency of the actuator 150 than the first frequency when the actuator 150 outputs the audio and the haptic of the voice guidance or button sound.

For example, the gain may be set for each of frequencies (e.g., fr1 to fr6) of a gain increase region 1700. In this case, the gain may be set to be larger at frequencies fr2 to fr6 far from the resonance frequency of the actuator than the frequency fr1 relatively close to the resonance frequency of the actuator.

Referring to FIGS. 16 and 17, in the haptic frequency domain 1620, the gain is set within ±3 dB, and in the voice guidance met (button sound) frequency domain 1610, the gain is set to 5 dB or higher by considering a frequency-specific attenuation level.

Meanwhile, even when only the voice guidance (or button sound) is output, the frequency-specific gain may be increased (5 dB or higher) in the voice guidance (button sound) region (300 Hz or higher). That is, further, the processor 130 or the speaker amplifier 140 converts the frequency characteristics of the audio signal by amplifying the audio region frequency band predetermined in the voice guidance or button sound when the actuator 150 outputs only the audio of the voice guidance or button sound.

A frequency of a voice guidance (person voice) or the button sound is spaced apart from the actuator resonance frequency band, so the gain needs to be set to improve the voice guidance (button sound) output performance at 300 Hz or higher.

Since the voice (button sound) frequency band of the actuator shows larger performance attenuation as being away from the actuator resonance frequency, the gain may be increased by 5 DB or higher at 300 Hz or higher in order to improve the output performance even when outputting only the voice guidance (or button sound).

Figure 18:
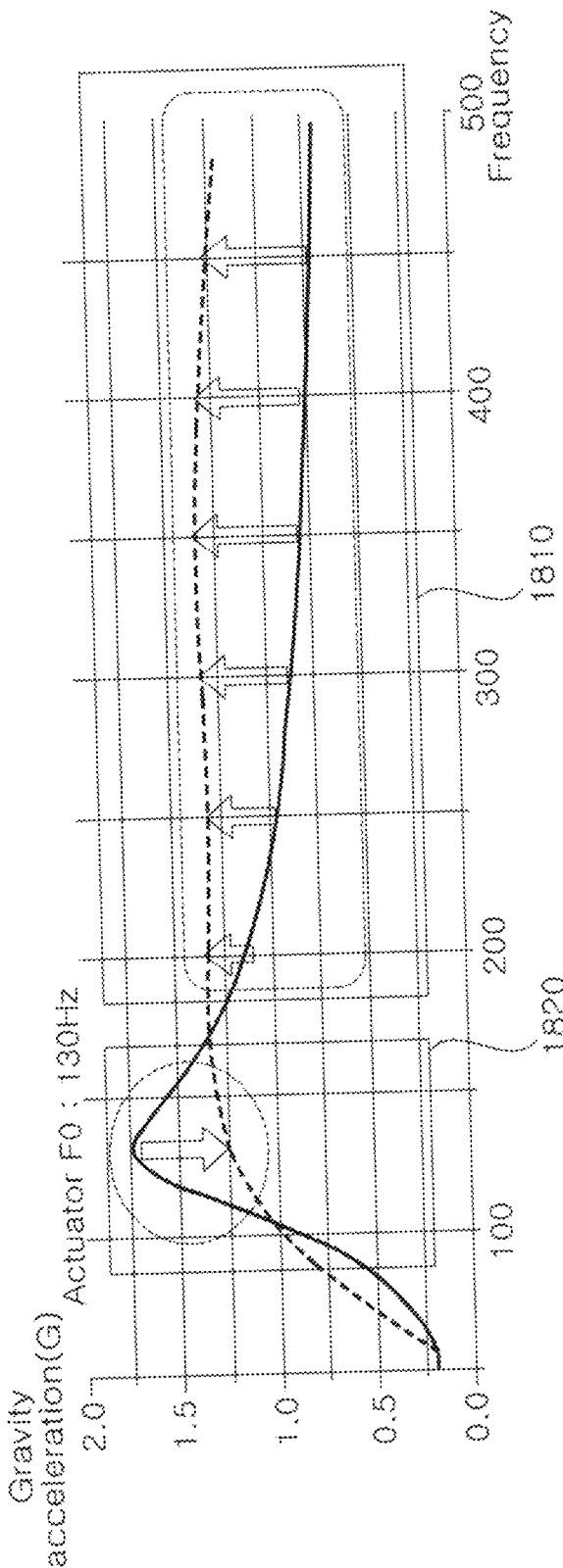
FIGS. 18 and 19 are diagrams referenced for a description of the audio output of the audio haptic output apparatus according to an embodiment of the present disclosure.
Figure 19:
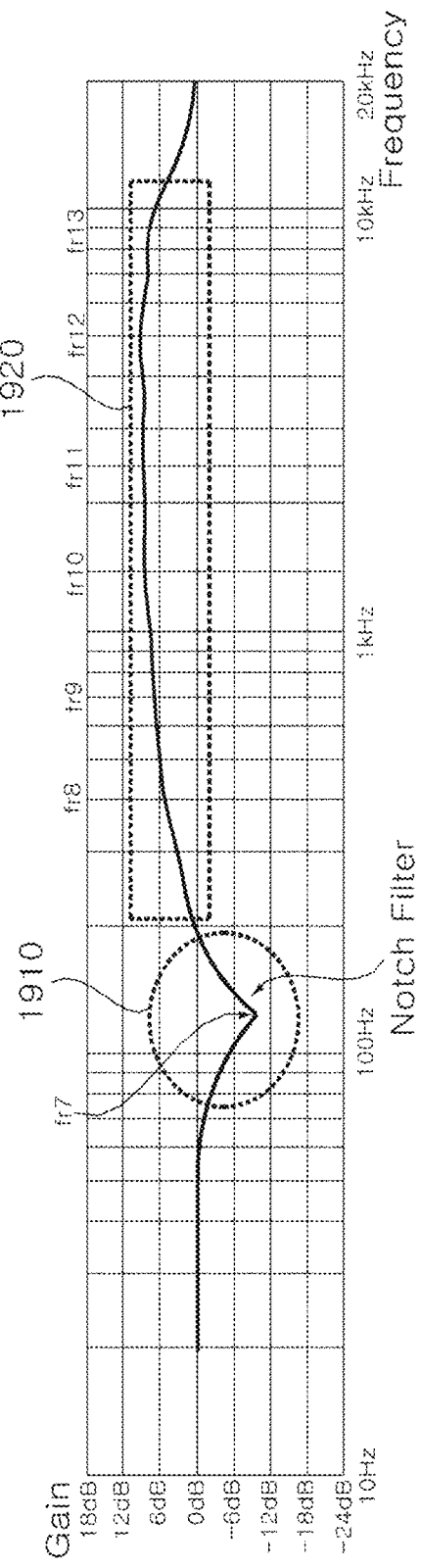

FIGS. 18 and 19 are diagrams referenced for a description of an audio output of the audio haptic output apparatus according to an embodiment of the present disclosure, and illustrate a case of outputting only a music audio. FIG. 18 illustrates a driving region according to the frequency when only the music is output, and FIG. 19 illustrates a frequency characteristic conversion algorithm when only the music is played.

Referring to FIGS. 18 and 19, the frequency-specific gain is increased (5 DB or higher) in a high-frequency (200 Hz or higher) domain 1810 higher than the resonance frequency domain 1820. Further, in the resonance frequency domain 1820, the gain may be attenuated by 5 DB or higher by applying a notch filter or a high-pass filter. In the case of the music, the frequency band is widely formed from a log frequency to a high frequency. Accordingly, a high signal level may be input at the haptic resonance frequency. In this case, a signal input which exceeds an output range of the actuator may be input, so the actuator damage or an inter-part collision may occur. In order to solve such a problem, the resonance frequency is attenuated, and in other audio frequency band 1810, the gain is increased. The improvement of the audio frequency band 1810 aims at compensation of the frequency characteristics of the actuator.

The processor 130 or the speaker amplifier 140 converts the frequency characteristics of the audio signal by attenuating a predetermined range of frequency band 1820 at the resonance frequency of the actuator 150, and amplifying a frequency band 1810 of at least some among other regions when the actuator 150 outputs only the music-type audio. Due to the notch filter or the high-pass filter, a resonance frequency domain 1910 including a resonance frequency fr7 may be attenuated. The gain may be set for each of frequencies (e.g., fr8 to fr13) of the gain increase region 1920. In this case, the gain may be set to be larger at frequencies fr9 to fr13 far from the resonance frequency fr7 of the actuator than the frequency fr8 relatively close to the resonance frequency fr7 of the actuator.

Figure 20:
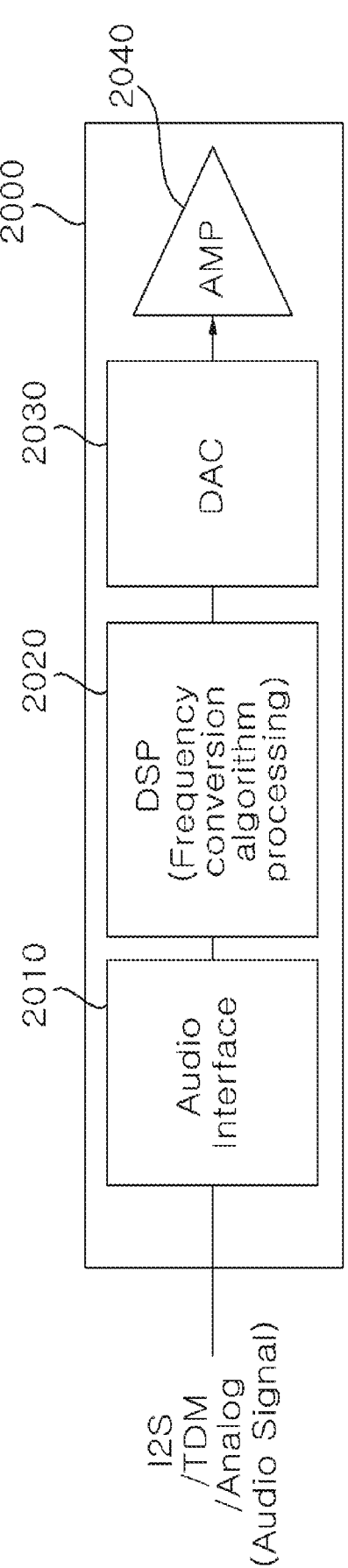
FIG. 20 is a diagram referenced for a description of a speaker amplifier internal block of the audio haptic output apparatus according to an embodiment of the present disclosure.

FIG. 20 is a diagram referenced for a description of a speaker amplifier internal block of the audio haptic output apparatus according to an embodiment of the present disclosure, and illustrates a speaker amplifier 2000 having a digital signal processor (DSP) embedded therein.

It may be difficult to process the frequency conversion algorithm 135 at a hardware level of the micom unit used in a general home appliance. Accordingly, it may be more preferable to process the frequency characteristic conversion algorithm 135 in the DSP 2020 embedded in the speaker amplifier 2000.

A audio-format signal such as I2S, TDM, analog, etc., is received through an audio interface 2010. The received audio signal is subjected to frequency control processing according to the frequency characteristic conversion algorithm 135, and delivered to the amplification amplifier 2040. The signal amplified by the amplifier 2040 may be input into the actuator 150, and the actuator 150 may vibrate according to the input signal, and output haptic, audio, and haptic/audio combination effects.

In some embodiments, the speaker amplifier 2000 may further include a Digital to Analog Converter (DAC) 2030 or analog to digital converter (ADC).

According to the embodiment of the present disclosure, a speaker and a vibration actuator may be replaced with one actuator 150, and a haptic driver and an audio amplifier may be replaced with one audio speaker amplifier 140. As a result, system complexity is reduced, so design becomes easy and the number of parts is reduced, it is possible to reduce cost.

Further, when the actuator 150 is used for the speaker in the home appliance, a speaker hole need not be separately manufactured, moisture penetration from the outside may be prevented, and an excellent design is possible.

According to an embodiment of the present disclosure, when the audio and the haptic are simultaneously output, the audio data and the haptic data are combined into an audio data form in advance, and stored in the memory 120, and called and used as necessary.

A combination scheme of the audio data and the haptic data may adopt a mixing scheme and/or a sequential output combination scheme. In the mixing scheme, the audio data and the haptic data are mixed to overlap, and synthesized into new data. In the sequential combination scheme, the haptic data is first transmitted, and the audio data is immediately subsequently transmitted. In the case of the haptic data, since it is possible to implement the haptic performance even with short data of 1 msec or less, the haptic data and the audio data may be felt as if being emotionally simultaneously output even though the audio data is output immediately after transmitting the haptic.

According to an embodiment of the present disclosure, the frequency control algorithm 135 is applied to use the actuator 150 for the haptic and the audio combinationally.

When only the haptic is output, the frequency conversion algorithm 135 may not be applied or only the haptic operation frequency band may be minutely adjusted. For example, the frequency control algorithm 135 may be applied only to the band (the region where the gravity acceleration is reduced to less than 30%). Further, a haptic signal optimized to the resonance frequency may be set to a gain of 0 dB, and when the haptic is used in a surrounding frequency region, may be set to a gain range of ±3 dB.

When only the voice guidance (or button sound) is output, the frequency conversion algorithm 135 may set the gain to increase only the audio region frequency. For example, the frequency-specific gain may be increased in the voice guidance (button sound) region of 300 Hz or higher.

Even when the haptic and the voice guidance (or button sound) are simultaneously output, only the audio region frequency may be increased. When the haptic and the voice guidance (or button sound) are simultaneously output, the frequency bands of the haptic and the voice guidance (or button sound) are separated, so a logic when outputting only the haptic may be applied to the haptic, and a logic when outputting only the voice guidance (or button sound) may be applied to the voice guidance (or button sound).

When only the music audio is output, the resonance frequency may be sharply attenuated, and the gain of the audio region frequency other than the resonance region may be increased. For example, at a frequency (200 Hz or higher) equal to or higher than the resonance frequency domain, the frequency-specific gain may be increased, and at the resonance frequency, the gain may be attenuated by 5 dB or higher.

Further, although the embodiments of the present disclosure have been illustrated and described above, the present disclosure is not limited to the aforementioned specific embodiments, various modifications may be made by a person with ordinary skill in the technical field to which the present disclosure pertains without departing from the subject matters of the present disclosure that are claimed in the claims, and these modifications should not be appreciated individually from the technical spirit or prospect of the present disclosure.

DETAILED DESCRIPTION OF MAIN ELEMENTS

110: Touch panel
120: Memory,
130: Processor
140, 2000: Speaker amplifier
150: Actuator

What is claimed is:

1. An audio haptic output apparatus comprising:
   a touch panel;
   a memory configured to store a plurality of effect data corresponding to a plurality of touch inputs;
   a processor configured to retrieve an effect data matched with a touch input through the touch panel from the memory, and generate an audio signal;
   a speaker amplifier configured to amplify and output a signal based on the audio signal; and
   an actuator configured to output an audio and a haptic based on the output signal of the speaker amplifier,
   wherein the actuator is a common actuator that outputs both the audio and the haptic,
   wherein the processor or the speaker amplifier is configured to convert frequency characteristics of the audio signal and output a converted signal to the actuator, when the effect data matches with the touch input through the touch panel,
   wherein the processor or the speaker amplifier is configured to convert the frequency characteristics of the audio signal according to different frequency conversion logics based on whether the actuator outputs only the haptic, or whether the actuator outputs both the audio and the haptic, and the speaker amplifier is configured to amplify the signal of which frequency is converted.

2. The audio haptic output apparatus of claim 1, wherein the processor or the speaker amplifier is configured to convert the frequency characteristics of the audio signal according to the different frequency conversion logics based on whether the actuator outputs both the audio and the haptic, or whether the actuator outputs only the audio.

3. The audio haptic output apparatus of claim 2, wherein the processor or the speaker amplifier is configured to convert the frequency characteristics of the audio signal by amplifying a gain only in a predetermined audio region frequency band predetermined for a voice guidance or button sound when the actuator outputs only an audio of the voice guidance or button sound.

4. The audio haptic output apparatus of claim 2, wherein the processor or the speaker amplifier is configured to convert the frequency characteristics of the audio signal by attenuating a predetermined range of frequency band at a resonance frequency of the actuator, and amplifying a frequency band of at least some regions among other regions when the actuator outputs only a music-type audio.

5. The audio haptic output apparatus of claim 1, wherein the processor or the speaker amplifier is configured to convert the frequency characteristics of the audio signal by increasing a gain only in a predetermined audio region frequency band predetermined for a voice guidance or button sound when the actuator outputs an audio and a haptic of the voice guidance or button sound.

6. The audio haptic output apparatus of claim 5, wherein the processor or the speaker amplifier is configured to convert the frequency characteristics of the audio signal by increasing the gain in the predetermined audio region frequency band predetermined for the voice guidance or button sound to be larger than a gain in a haptic frequency domain when the actuator outputs an audio and a haptic of the voice guidance or button sound.

7. The audio haptic output apparatus of claim 1, wherein the processor or the speaker amplifier is configured to convert the frequency characteristics of the audio signal by applying a first gain in a first frequency in the audio region frequency band predetermined for a voice guidance or button sound and applying a second gain larger than the first gain in a second frequency that is further from a resonance frequency of the actuator than the first frequency when the actuator outputs an audio and a haptic of the voice guidance or button sound.

8. The audio haptic output apparatus of claim 1, wherein the processor or the speaker amplifier is configured not to convert the frequency characteristics of the audio signal when the actuator outputs only the haptic, or converts the frequency characteristics of the audio signal by increasing a frequency gain of a region which deviates from a predetermined range of frequency band at a resonance frequency of the actuator.

9. The audio haptic output apparatus of claim 1, wherein the plurality of effect data stored in the memory includes haptic data, audio data, and a combination data in which the haptic data and the audio data are combined.

10. The audio haptic output apparatus of claim 9, wherein the haptic data, the audio data, and the combination data are encoded to audio type data format, and stored.

11. The audio haptic output apparatus of claim 10, wherein the combination data is generated by sequentially combining the haptic data and the audio data in order, or generated by mixing the haptic data and the audio data to overlap.

12. The audio haptic output apparatus of claim 1, wherein the processor or the speaker amplifier is configured to convert and output the frequency characteristics of the audio signal so that a vibration of the actuator upon a touch input in a second region positioned further from the actuator than a first region is larger than a vibration of the actuator upon a touch input in the first region of the touch panel.

13. An audio haptic output apparatus comprising:
a touch panel;
a memory configured to store a plurality of effect data corresponding to a plurality of touch inputs; and
an actuator configured to output at least of an audio and a haptic based on an effect data matched with a touch input through the touch panel among the plurality of effect data stored in the memory,
wherein the plurality of effect data stored in the memory includes haptic data, audio data, and a combination data in which the haptic data and the audio data are combined,
wherein the actuator is a common actuator that outputs both the audio and the haptic; and
a processor configured to retrieve the effect data matched with the touch input through the touch panel from the memory, and generating an audio signal;
a speaker amplifier configured to amplify and output a signal based on the audio signal; and
wherein the processor or the speaker amplifier is configured to convert and output frequency characteristics of the audio signal so that a vibration of the actuator upon a touch input in a second region positioned further from the actuator than a first region is larger than a vibration of the actuator upon a touch input in the first region in the touch panel.

14. The audio haptic output apparatus of claim 13, wherein the combination data is generated by sequentially combining the haptic data and the audio data in order, or generated by mixing the haptic data and the audio data to overlap.

15. The audio haptic output apparatus of claim 13, wherein
the actuator is configured to output at least one of the audio and the haptic based on the output signal of the speaker amplifier,
wherein the processor or the speaker amplifier is configured to convert frequency characteristics of the audio signal and output a converted signal to the actuator, when the effect data matched with the touch input through the touch panel includes audio data.

16. The audio haptic output apparatus of claim 15, wherein the processor is configured to convert the retrieved effect data into an analog audio signal or an audio signal according to an audio communication standard.

17. A home appliance comprising
the audio haptic output apparatus of claim 13.

* * * * *